US006962875B1

(12) United States Patent
Stamper

(10) Patent No.: US 6,962,875 B1
(45) Date of Patent: Nov. 8, 2005

(54) VARIABLE CONTACT METHOD AND STRUCTURE

(75) Inventor: Anthony K. Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/710,000

(22) Filed: Jun. 11, 2004

(51) Int. Cl.[7] .............................................. H01L 21/44

(52) U.S. Cl. ...................... 438/672; 438/674; 438/619; 438/623; 438/238; 438/381; 438/379

(58) Field of Search ................................ 438/672, 619, 438/623, 238, 381, 379, 674, 50; 257/532, 257/232, 704, 295, 296, 303

(56) References Cited

U.S. PATENT DOCUMENTS

| | | | | |
|---|---|---|---|---|
| 5,910,755 | A | 6/1999 | Mishiro et al. | |
| 6,022,797 | A | 2/2000 | Ogasawara et al. | |
| 6,388,208 | B1 | 5/2002 | Kiani et al. | |
| 6,514,849 | B1 | 2/2003 | Hui et al. | |
| 6,542,352 | B1 | 4/2003 | Devoe et al. | |
| 6,573,822 | B2 * | 6/2003 | Ma et al. .................... | 336/223 |
| 2002/0064947 | A1 | 5/2002 | Itabashi et al. | |

* cited by examiner

*Primary Examiner*—David Zarneke
*Assistant Examiner*—Igwe U. Anya
(74) *Attorney, Agent, or Firm*—Schmeiser, Olsen & Watts; Anthony Canale

(57) ABSTRACT

A method of forming a variable contact structure, and the structure so formed, comprising forming a via within the device, wherein a diameter of the via is variably determined depending upon the number of wires to be contacted.

17 Claims, 22 Drawing Sheets

VARIABLE CONTACT METHOD AND STRUCTURE

BACKGROUND OF INVENTION

1. Technical Field

The present invention relates generally to semiconductor devices, and more particularly, to a method of forming an integrated circuit having variable wiring options, and the structure so formed.

2. Related Art

When manufacturing integrated circuit devices, such as tunable devices that can be trimmed to achieve a target value, it is desirable to have variable wiring options. Currently, wiring configurations may be varied using multiple mask sets, switching or fusing circuitry, or other similar techniques.

The problem with using multiple mask sets to provide variable wiring options is that increasing the number of mask sets increases manufacturing costs. The use of switching or fusing to provide multiple wiring options adds cost because additional wiring is required, and the fuses need to be blown, which adds cost. The additional wiring needed for fusing also occupies valuable space in the device, and potentially increase capacitance.

Therefore, there is a need in the industry for a method and structure that provides variable wiring options and overcomes the above and other problems.

SUMMARY OF INVENTION

The present invention provides a method of forming a variable contact structure that solves the above-stated, and other, problems.

A first aspect of the invention provides method of forming a variable contact structure, comprising: providing a tunable device; determining a measurable parameter of the tunable device; and forming an electrically conductive via within the tunable device, using a single mask, wherein a diameter of the via is determined based upon the measurable parameter, and wherein the diameter of the via may be formed larger than an opening in the mask by varying processing parameters used to form the via.

A second aspect of the invention provides a method of forming a precision circuit structure, comprising: providing a tunable device having at least two circuit structures; determining a measurable parameter of the tunable device; and if the measurable parameter is within an allowed tolerance value of a target value, then: forming an electrically conductive via within the tunable device, using a single mask, having a first diameter to form electrical contact with the first circuit structure; and if the measurable parameter is not within an allowed tolerance value of a target value, then: forming an electrically conductive via within the tunable device, using the single mask, having a second diameter, wherein the second diameter is greater than the first diameter, to form electrical contact with the first circuit structure and the second circuit structure.

A third aspect of the invention provides a semiconductor device, comprising: at least two wires within a device; and a via formed within the device to provide electrical connection to the wire, wherein a diameter of the via depends upon the number of wires needing electrical connection.

The foregoing and other features and advantages of the invention will be apparent from the following more particular description of the embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Although certain embodiments of the present invention will be shown and described in detail, it should be understood that various changes and modifications might be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
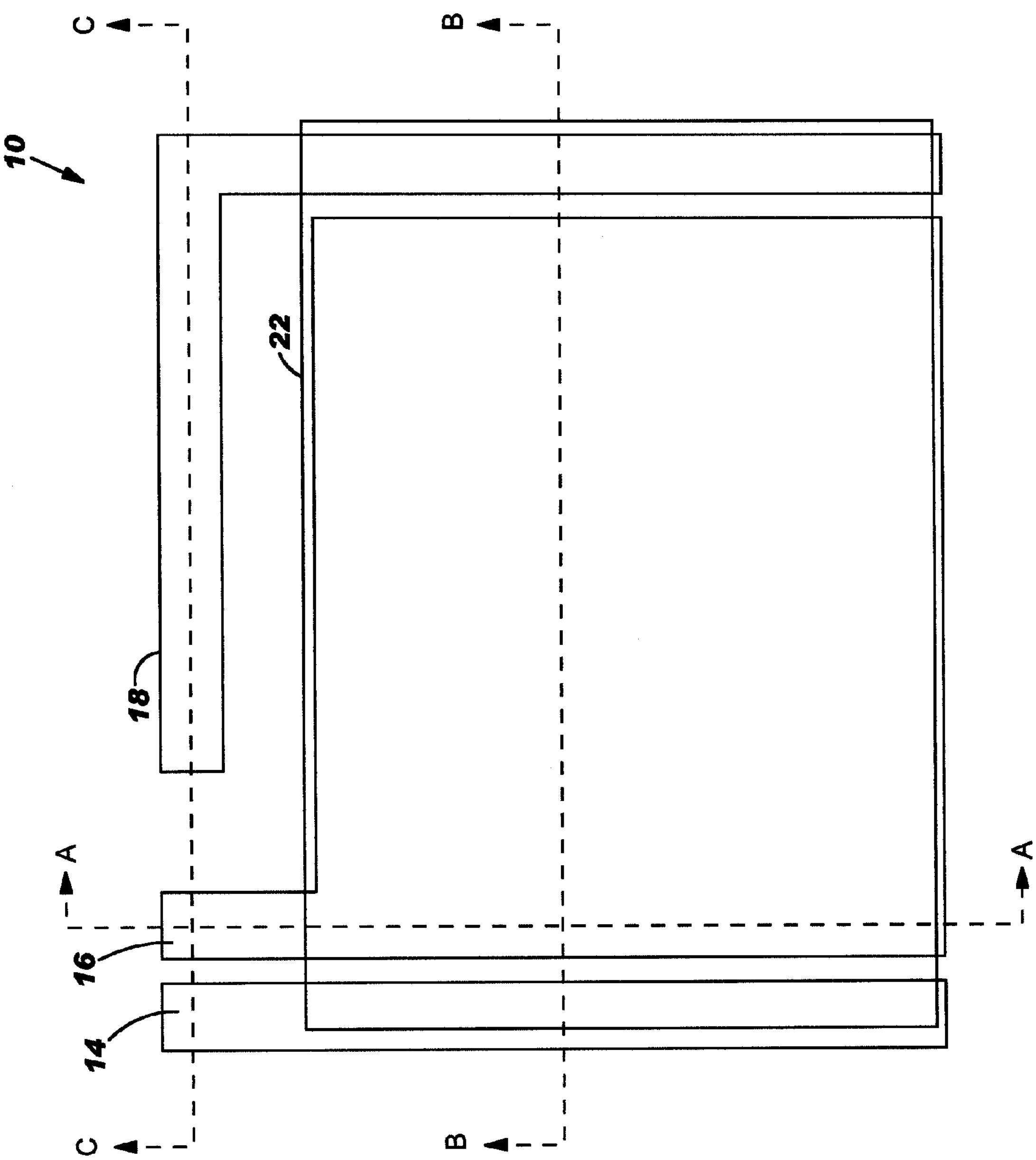
FIG. 1 depicts a top view of a MIM capacitor device in accordance with embodiments of the present invention.
Figure 2A:
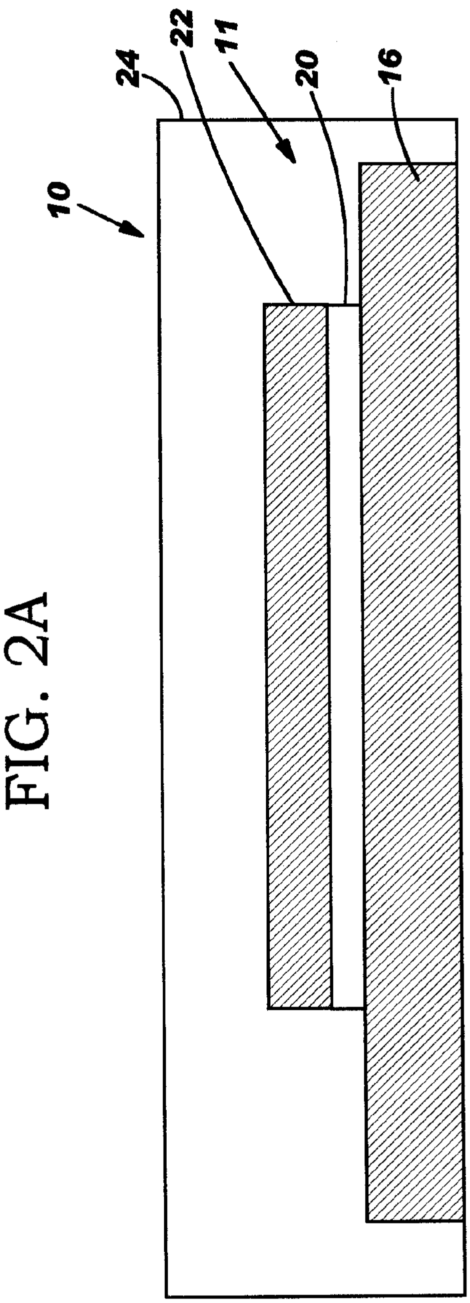
FIG. 2A depicts a cross-sectional view of the device of FIG. 1 along line A—A.
Figure 2B:
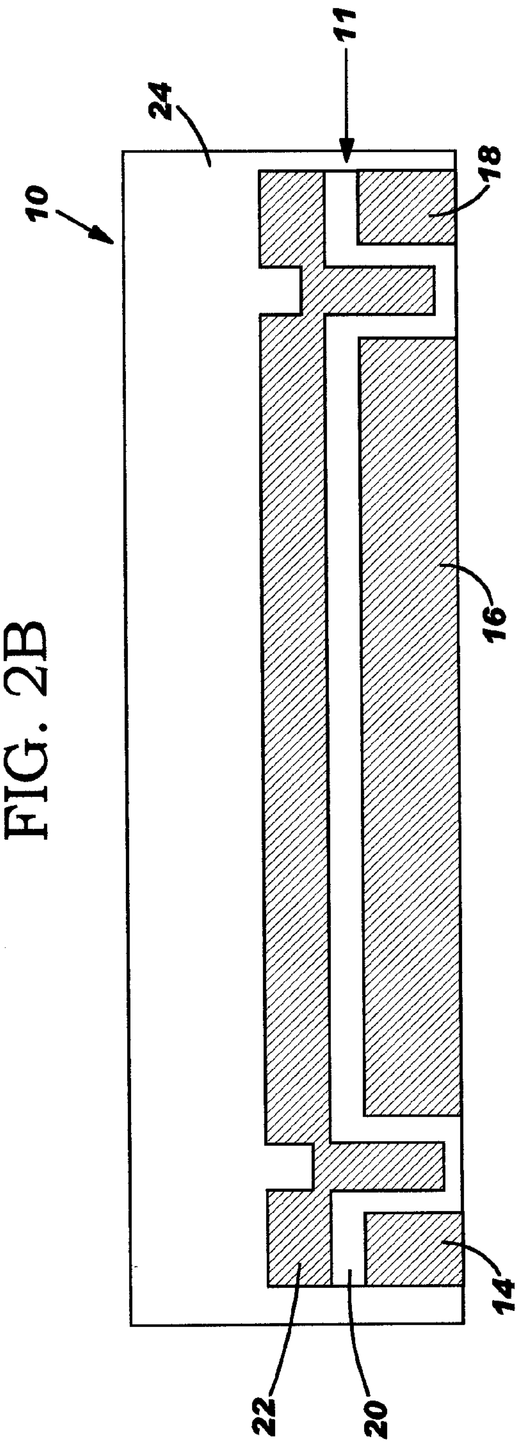
FIG. 2B depicts a cross-sectional view of the device of FIG. 1 along line B—B.
Figure 2C:
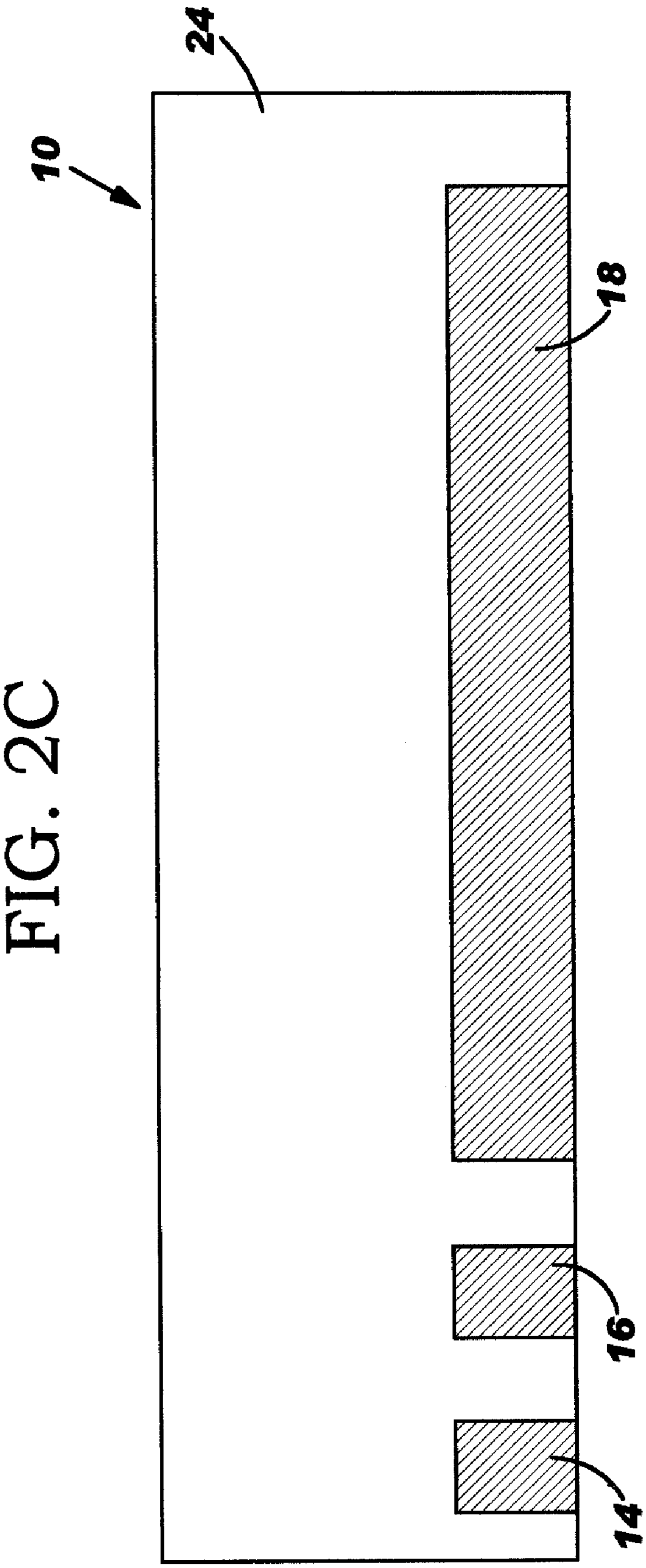
FIG. 2C depicts a cross-sectional view of the device of FIG. 1 along line C—C.

FIG. 1 shows a top view of a tunable device 10. FIGS. 2A, 2B and 2C show cross-sectional views of FIG. 1 along lines A—A, B—B and C—C, respectively. In this example the tunable device 10 comprises a thin film passive device, such as a MIM (metal-insulator-metal) capacitor 11. Alternatively, the tunable device 10 could comprise a VPP (vertical parallel plate) capacitor, a resistor (illustrated infra), an inductor, etc.

The MIM capacitor 11 (refer to FIGS. 2A and 2B) of the present example comprises a bottom conductive plate comprising three separate electrically conductive wires 14, 16, 18, a dielectric 20 and a top conductive plate 22. The top 22 and bottom 14, 16, 18 plates comprise subtractive etch or damascene metal wires or lines as conventionally used. The dielectric 20 comprises an insulative material such as, one or more layers of $Si_3N_4$, $SiO_2$, $Al_2O_3$, $Ta_2O_5$ etc., as is commonly used. The MIM capacitor 11 is surrounded by an insulative material 24, such as $SiO_2$, or other commonly used material. The insulative material 24 may be made up of multiple layers of inter-metal dielectric material, as is known in the art.

Following deposition of the MIM dielectric layer 20 illustrated in FIGS. 2A–2C, as is known in the art, the need for electrical connection to one or more wires may be determined by acquiring a measured capacitance approximation using a variety of techniques. For example, the thickness of the MIM dielectric layer 20 can be measured to approximate the final capacitance value of the MIM capacitor 10.

There are a variety of techniques that may be used to measure the thickness of the MIM dielectric layer 20. For example, the dielectric layer 20 can be measured by physical measuring using optical methods, i.e., ellipsiometry, as known in the art. Alternatively, the thickness of the MIM dielectric layer 20 can be measured using a scanning electron microscope or transmission electron microscope to image a cross-section of a monitor wafer formed along side the MIM capacitor 10. An alternative method of measuring the thickness of the dielectric layer 20 is to locally remove the dielectric layer 20, by either patterning the device 10 with photoresist and etching the dielectric layer 20 selectively to the underlying layer (14, 16, 18), or by using a focused ion beam to selectively etch the dielectric layer 20 selectively to the underlying dielectric layer (14, 16, 18), and then to use a measurement tool, such as a AFM (atomic force microscope) or step height measurement tool, to determine the thickness of the dielectric layer 20. Another alternative method of predicting if the MIM capacitor device 10 will have the desired capacitance value after the passive elements are fabricated is to measure the stoichiometry of the dielectric layer 20, using methods such as EDXRF (energy dispersive X-ray fluorescence), Auger, or SIMS (secondary ion mass spectroscopy) to determine the atomic composition of the dielectric layer 20. For thin film MIM dielectrics composed of multiple layers, such as $Al_2O_3/Ta_2O_5/Al_2O_3$, knowing the atomic concentration of each element can be used to predict the final capacitance. (For thin film resistors, discussed infra, such as TaN, the resistance is determined by both the thickness and the nitrogen content and the final resistance can be predicted by knowing the nitrogen content.)

If the measured thickness of the dielectric layer 20 is "too thick" then the final capacitance value of the MIM capacitor device 10 will likely be "too low". For example, a dielectric layer 20, such as $Si_3N_4$ (target thickness of 30 nm), having a thickness greater than 31 nm would be considered "too thick", which would likely lead to a low capacitance value. Therefore, the approximated capacitance value of the device 10, acquired by measuring the thickness of the dielectric layer 20, may be used to determine the diameter of the vias to be formed.

Figure 3:
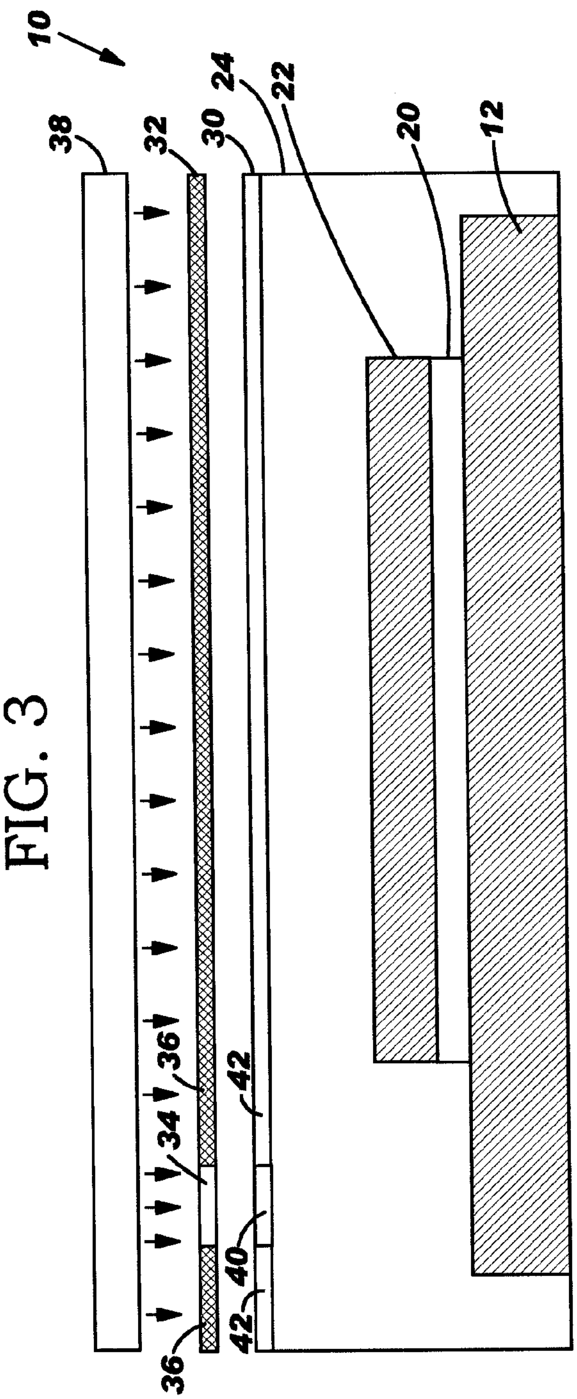
FIG. 3 depicts a cross-sectional view of the device of FIG. 1 along line A—A during photolithography.
Figure 4:
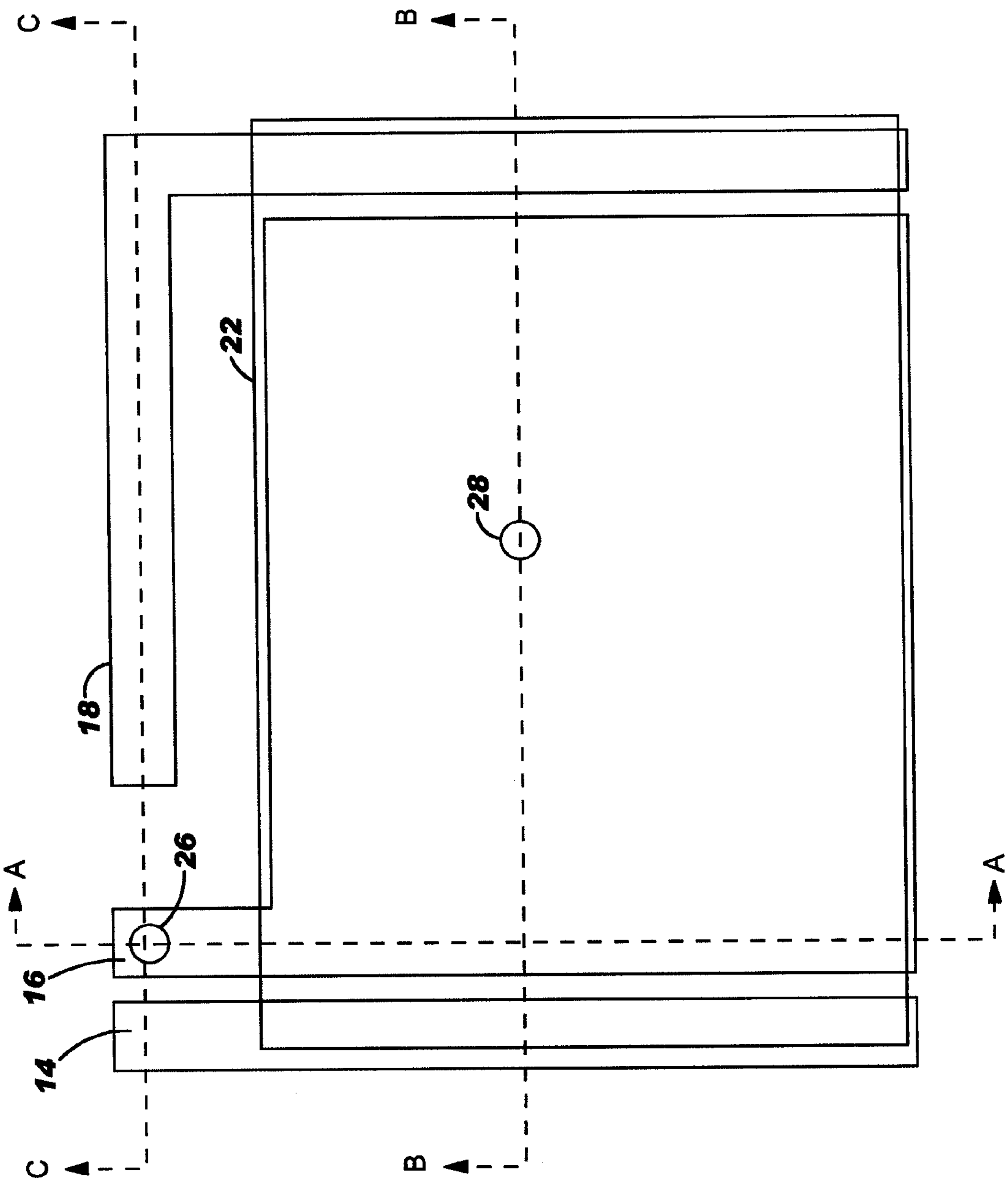
FIG. 4 depicts a top view of the device of FIG. 1 having a first pair of vias formed therein in accordance with embodiments of the present invention.

In the event the approximated capacitance value is within an allowed tolerance value of a target capacitance value then a first via 26 and a second via 28 are formed within the device 10 that forms an electrical connection to the nominal capacitance wire 16 (FIG. 4). To form the vias 26, 28 a positive photoresist 30 is deposited over the insulative layer 24 of the device 10 (FIG. 3). A mask 32 is then used to pattern the photoresist 30. The mask 32 comprises a substantially transparent region 34 for each via to be formed (in this example there would be two substantially transparent regions, one of the first via 26 and a second for the second via 28, however, only one substantially transparent region can be seen in the A—A cross-section), and a substantially non-transparent, or substantially opaque, region 36 surrounding the substantially transparent region 34. A radiation source 38 projects light onto the mask 32 thereby exposing the photoresist 30 in the substantially transparent region(s) 34 of the mask 32. The exposed region(s) 40 of photoresist 30 are removed, leaving the unexposed region(s) 42 of photoresist 30. An etch process, such as reactive ion etching (RIE), laser ablation, wet etch, etc., is performed to remove a portion of the insulative layer 24 within the exposed region(s) 40 of photoresist 30 thereby forming the first and second vias 26, 28. The etch removes the insulative material 24 down to the MIM capacitor 11 (refer to FIGS. 5A–5C).

Alternatively a negative photoresist could be used to pattern the first and second vias 26, 28. In which case the substantially transparent resion(s) 34 and the substantially opaque region(s) 36 of the mask 32 would be inverted. The light from the radiation source 38 would then pass through region(s) 36 down to regions 42 of the photoresist 30. The unexposed regions(s) 36 of the photoresist 30 would be removed, leaving the exposed region(s) 40 of the photoresist 30. The etch process would then remove the exposed region(s) 40 of the photoresist 30 and a portion of the insulative layer 24 beneath the exposed region(s) 40 of photoresist 30 thereby forming the first and second vias 26, 28.

Figure 5A:
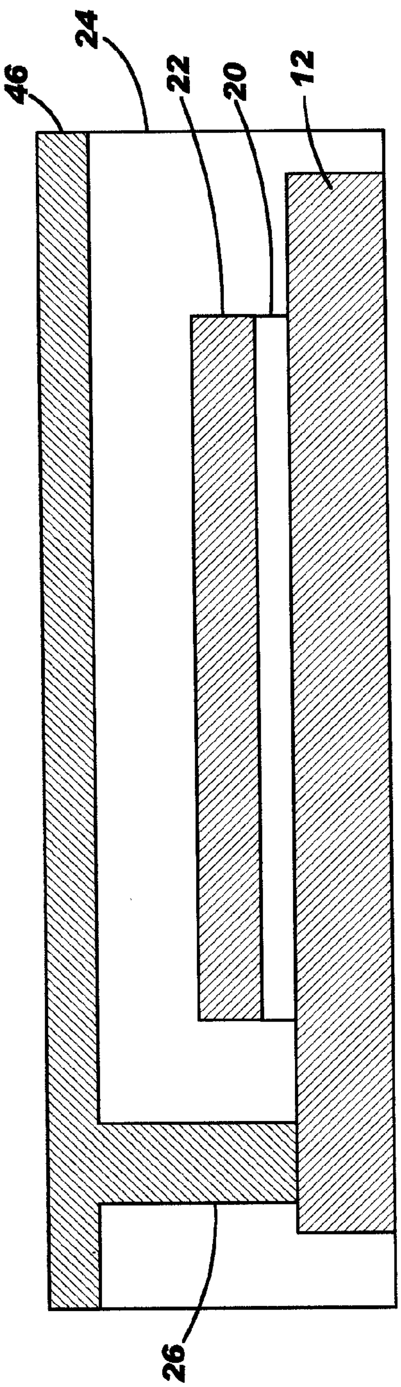
FIG. 5A depicts a cross-sectional view of the device of FIG. 4 along line A—A having a conductive layer thereon.
Figure 5B:
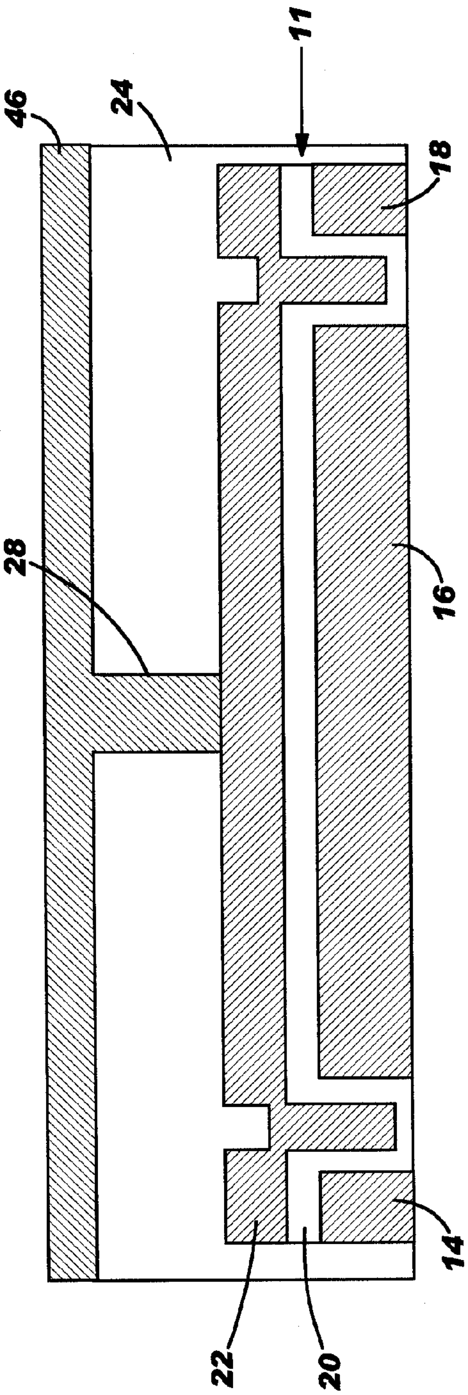
FIG. 5B depicts a cross-sectional view of the device of FIG. 4 along line B—B having a conductive layer thereon.
Figure 5C:
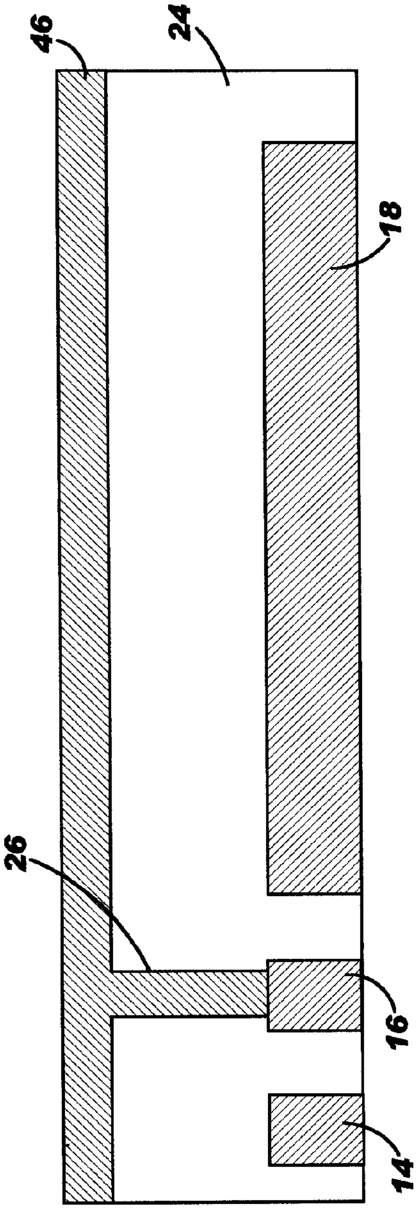
FIG. 5C depicts a cross-sectional view of the device of FIG. 4 along line C—C having a conductive layer thereon.
Figure 6A:
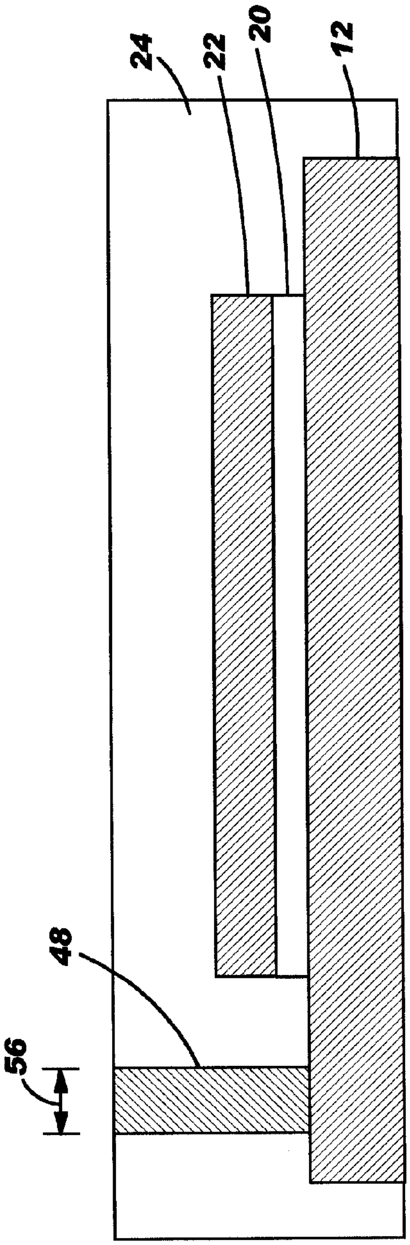
FIG. 6A depicts a cross-sectional view of the device of FIG. 4 along line A—A following polishing.
Figure 6B:
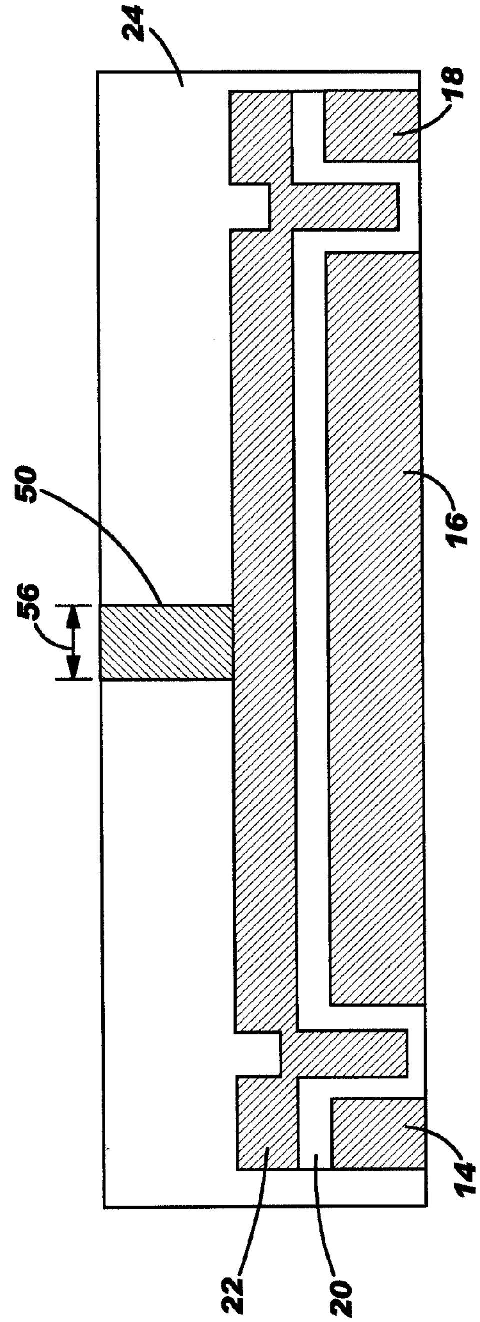
FIG. 6B depicts a cross-sectional view of the device of FIG. 4 along line B—B following polishing.
Figure 6C:
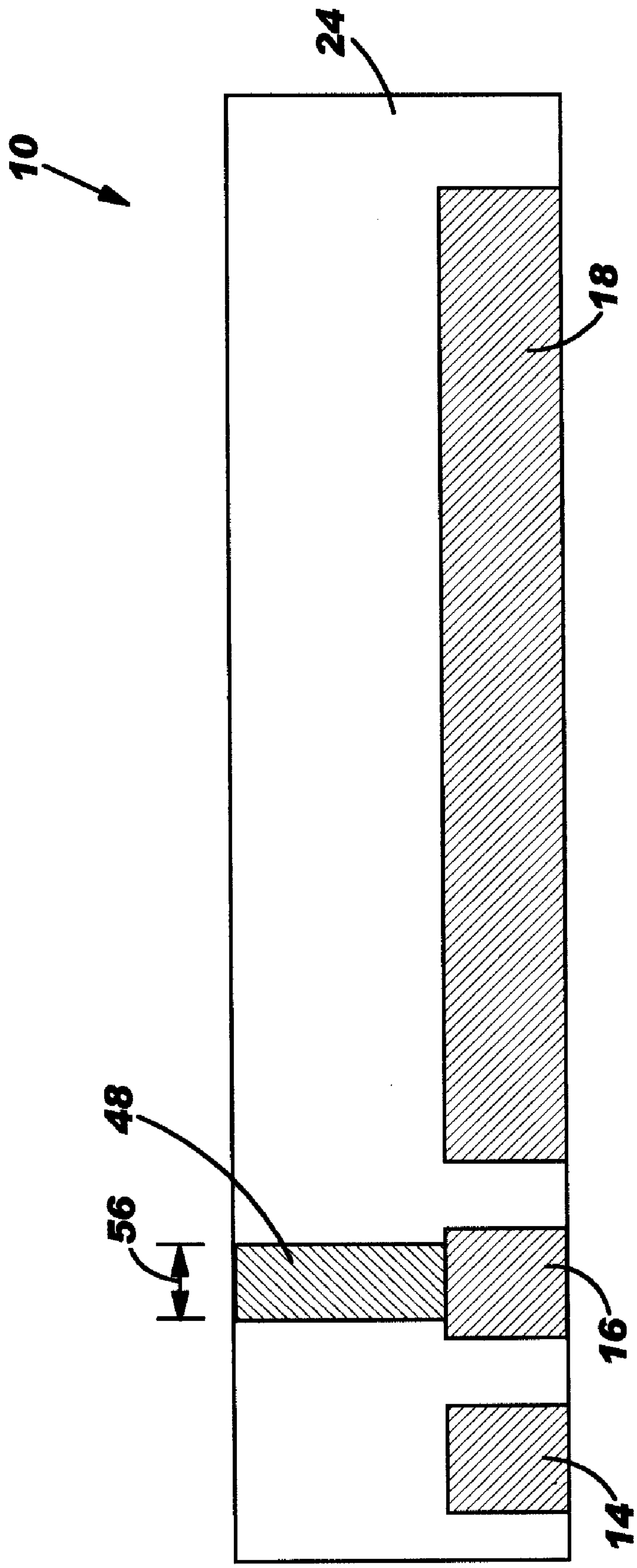
FIG. 6C depicts a cross-sectional view of the device of FIG. 4 along line C—C following polishing.

As illustrated in FIGS. 5A, 5B and 5C, a conductive layer 46 is then deposited over the insulative layer 24 of the device 10, filling the first and second vias 26, 28. A polishing operation is performed to remove the excess conductive material on the surface of the insulative layer 24 leaving the conductive material 46 within the first and second vias 26, 28 thereby forming a first and second electrically conductive vias 48, 50 (see FIGS. 6A, 6B and 6C). Alternatively, the first and second vias 26, 28 could have been electrolessly plated, or filled using a selective CVD deposition, with a conductive material to form the electrically conductive vias 48, 50, which eliminates the excess, or overburden, of conductive material 46 shown in FIGS. 5A–5C.

Figure 7:
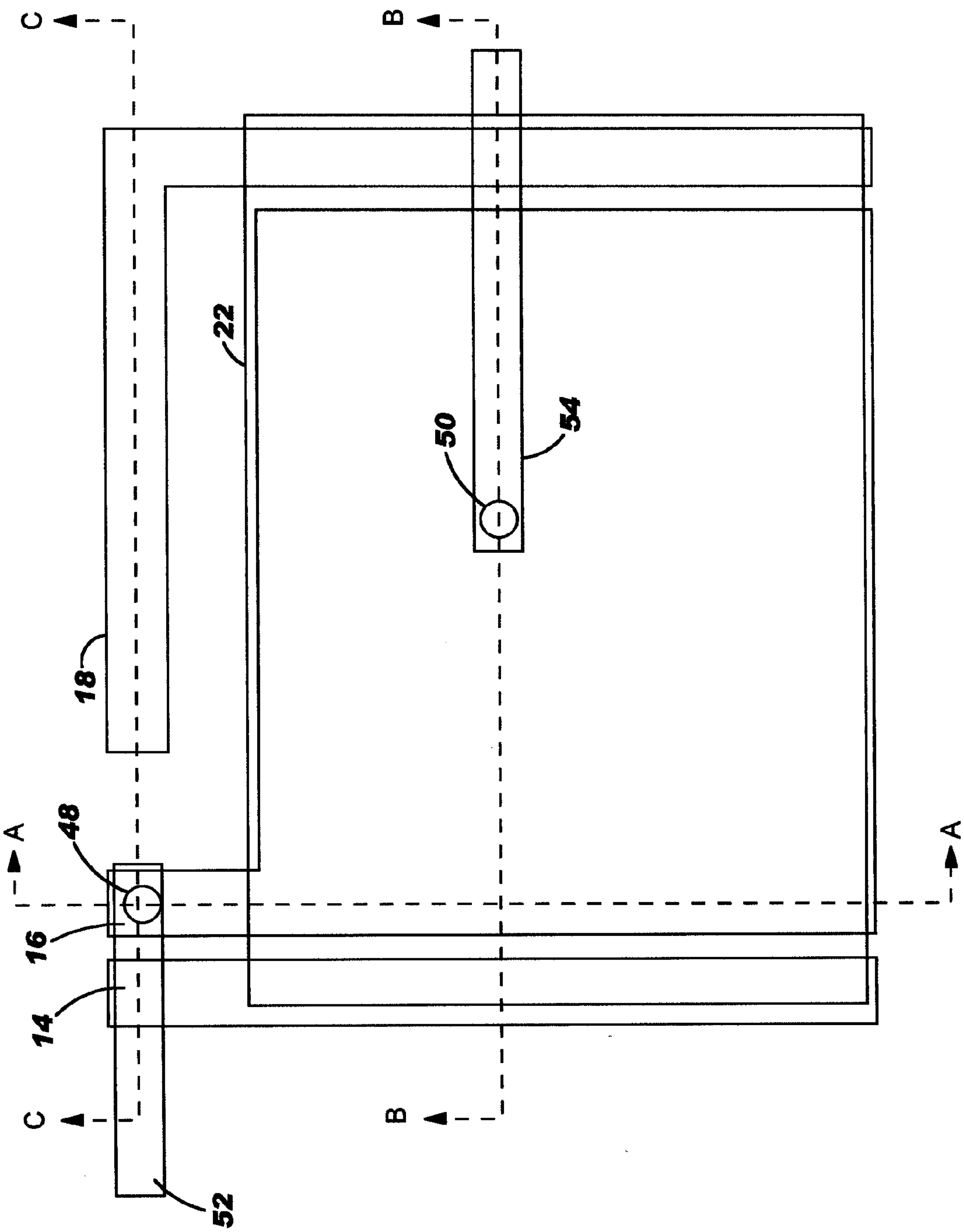
FIG. 7 depicts a top view of the device of FIG. 4 having a first pair of wires formed therein.
Figure 8A:
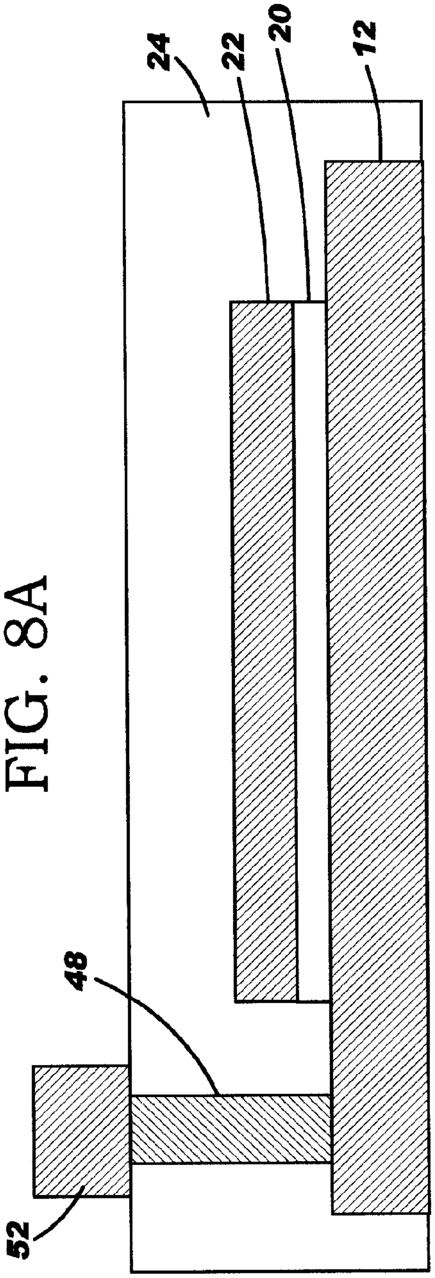
FIG. 8A depicts a cross-sectional view of the device of FIG. 4 along line A—A.
Figure 8B:
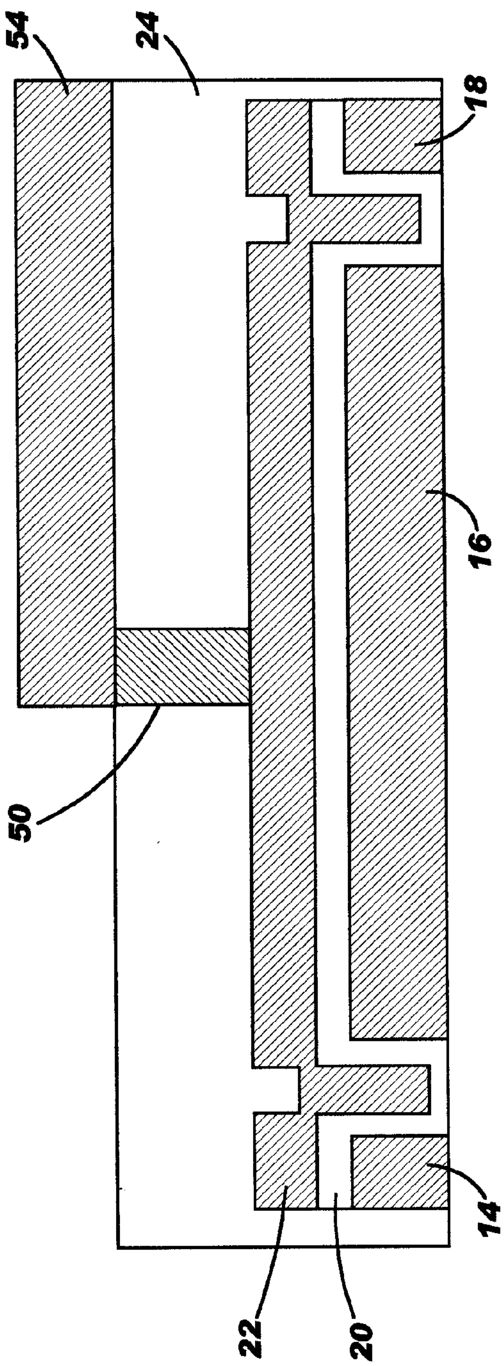
FIG. 8B depicts a cross-sectional view of the device of FIG. 7 along line B—B.
Figure 8C:
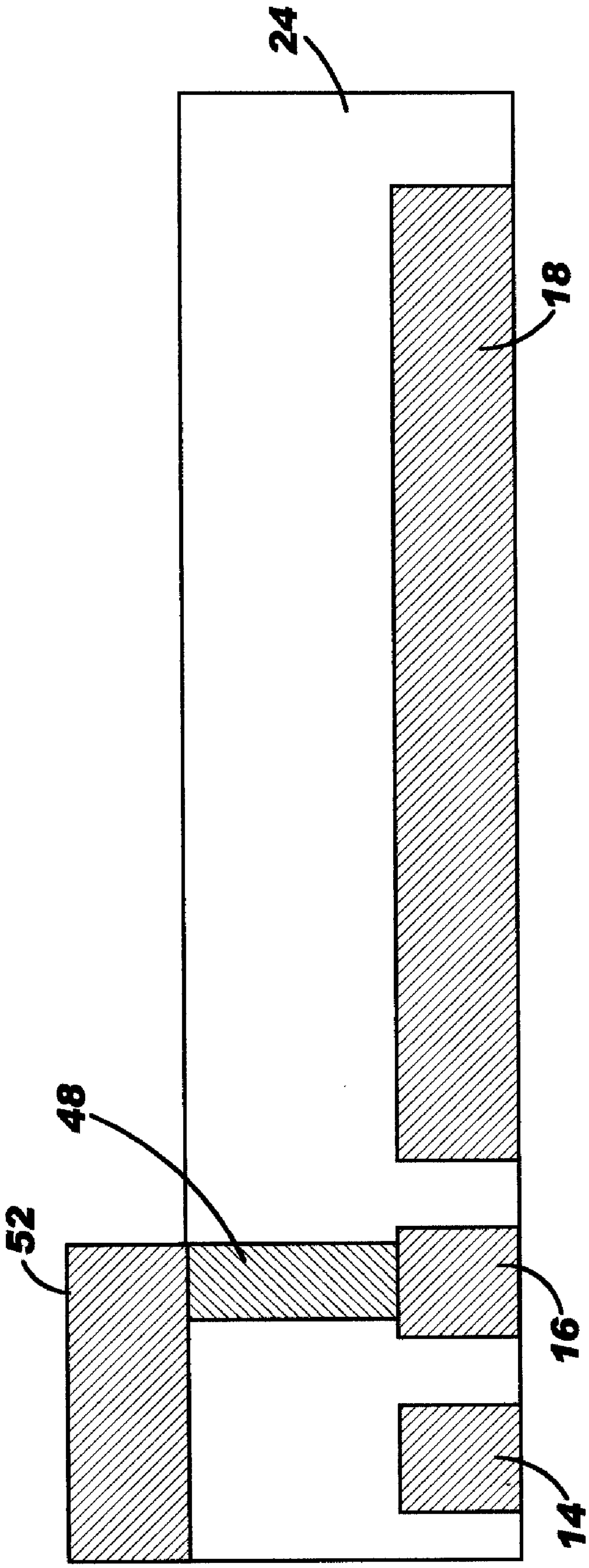
FIG. 8C depicts a cross-sectional view of the device of FIG. 7 along line C—C.

As illustrated in FIG. 7, a first wire 52 is then formed over the insulative layer 24 in the region of, and electrically connected to, the first electrically conductive via 48, which is electrically connected to the second wire 16 of the bottom plate of the MIM capacitor 11 (refer to FIGS. 8A and 8C). Similarly, a second wire 54 is formed over the insulative layer 24 in the region of, and electrically connected to, the second electrically conductive via 50, which is electrically connected to the top plate 22 of the MIM capacitor 11 (refer to FIG. 8B).

In the example illustrated in FIGS. 7 and 8A–8C, the first and second electrically conductive vias 48, 50, have a first diameter 56 (refer to FIGS. 6A and 6C) that is purposefully selected to form electrical connection to only one wire of the bottom plate of the MIM capacitor 11 (see FIG. 8C). In this example, electrical connection is made to the second wire 16, (the nominal capacitor), and not the other two wires 14, 18 (the first and second trim capacitors) because the lowest capacitance value is desired. When connection is made to only the second wire 16 (nominal capacitor) the MIM capacitor 11 measures its lowest possible capacitance value.

Figure 9:
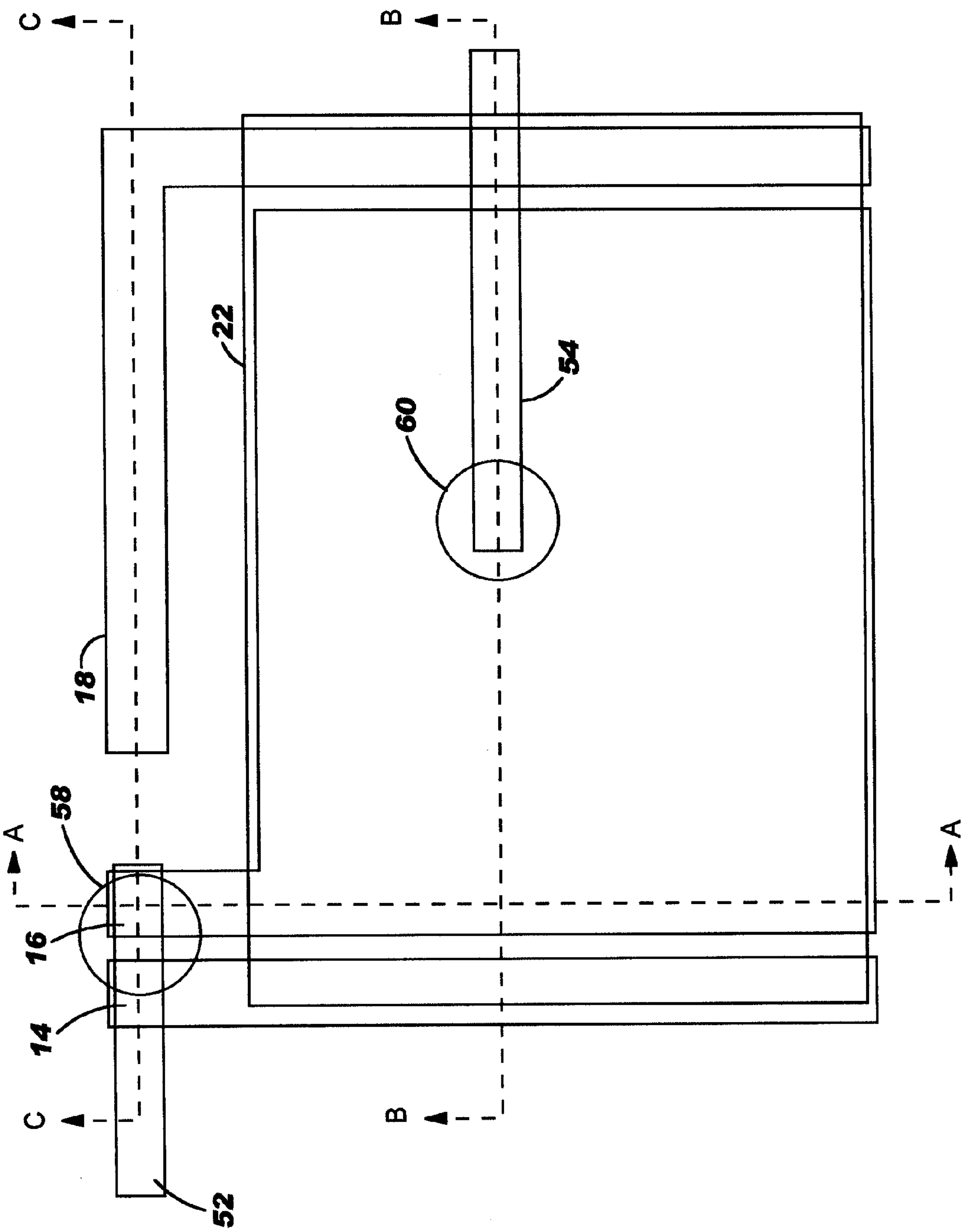
FIG. 9 depicts a top view of the device of FIG. 1 having a second pair of vias formed therein in accordance with the present invention.
Figure 10:
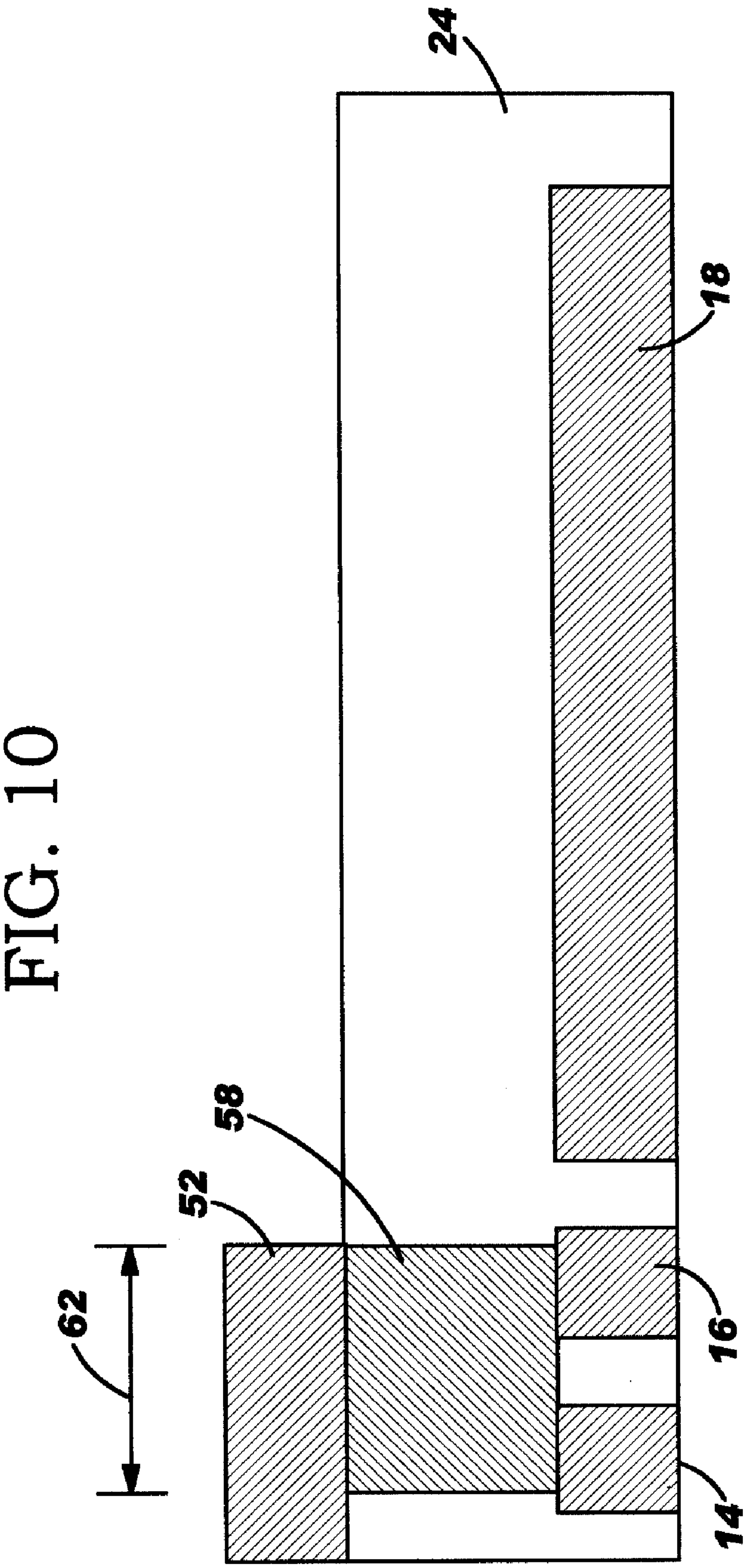
FIG. 10 depicts a cross-sectional view of the device of FIG. 9 along line C—C.
Figure 11:
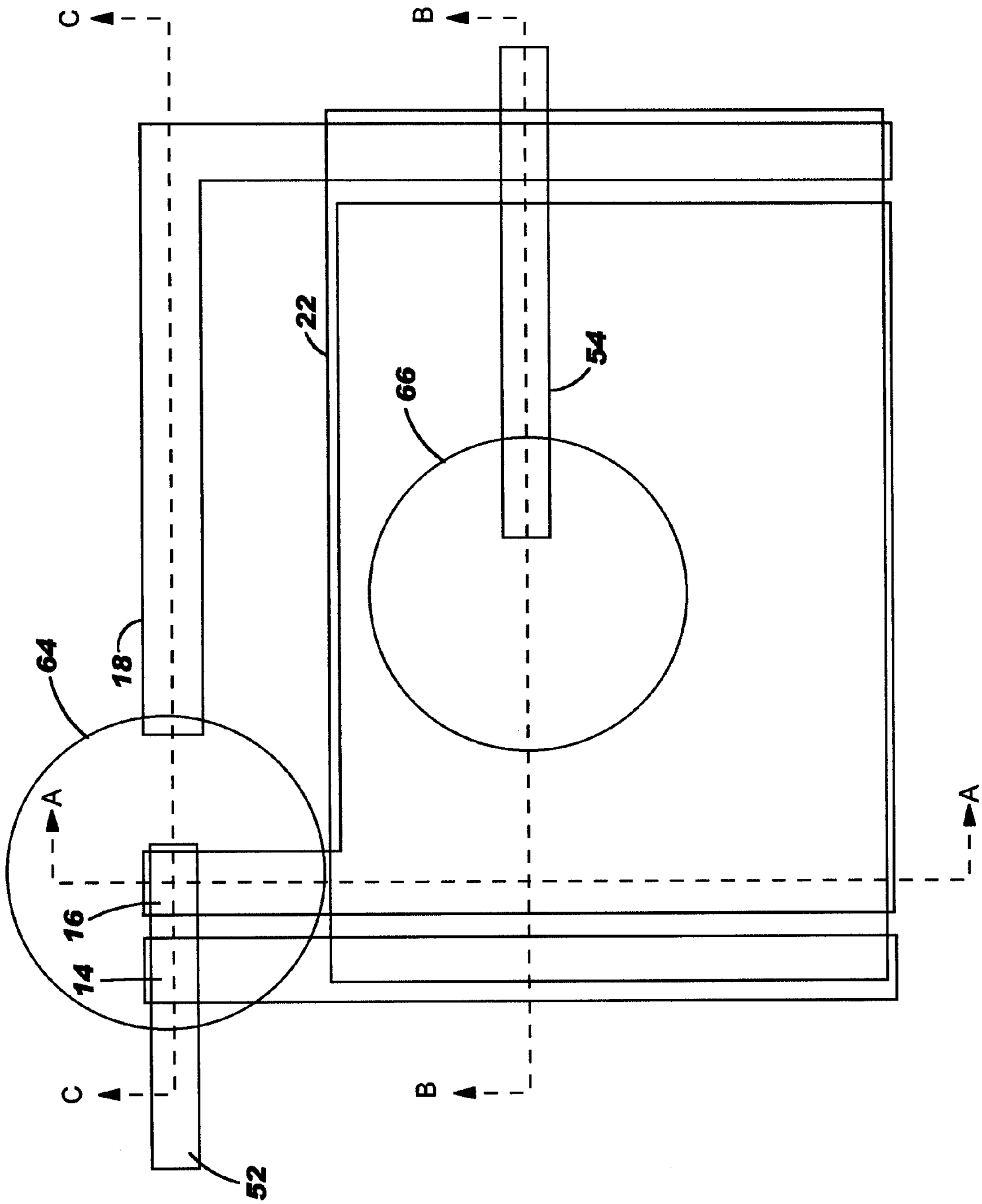
FIG. 11 depicts a top view of the device of FIG. 1 having a third pair of vias formed therein in accordance with the present invention.
Figure 12:
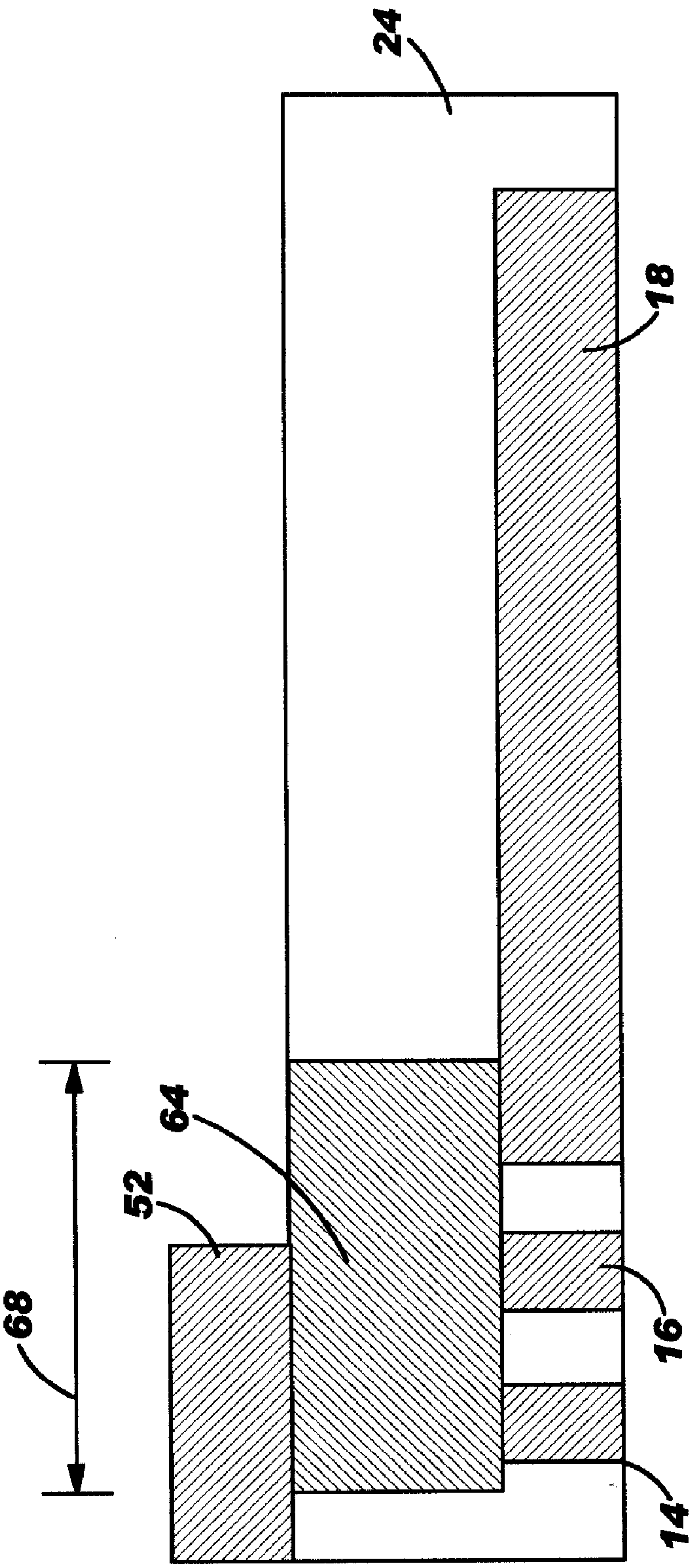
FIG. 12 depicts a cross-sectional view of the device of FIG. 11 along line C—C.

In the event the approximated capacitance value obtained supra was not within an allowed tolerance value of the target capacitance value then vias may be formed having a diameter larger than the diameter 56 of the first pair of vias 48, 50 to form electrical connection to two or more wires, e.g., the first and second trim capacitor wires 14, 18. For example, a pair of second vias 58, 60 (see FIG. 9), having a second diameter 62 (see FIG. 10), may be formed in accordance with the present invention to electrically connect the nominal capacitance wire 16 in parallel with a first trim capacitance wire 14. The diameter 62 of the second pair of vias 58, 60 is greater than the diameter 56 of the first pair of vias 48, 50 and therefore, electrically connects two wires rather than one wire (refer to FIG. 10, a cross-sectional view of the device of FIG. 9 along line C—C). Likewise, a third pair of vias 64, 66, having a third diameter 68, may be formed in accordance with the present invention to connect a second trim capacitance wire 18 in parallel with the nominal capacitance wire 16 and the first trim capacitance wire 14 (see FIGS. 11 and 12). As illustrated in FIG. 12 (a cross-sectional view of the device of FIG. 11 along line C—C), the diameter 68 of the third pair of vias 64, 66 allows for the electrical connection of three sets of wires, the nominal capacitance wire 16, the first trim capacitance wire 14 and the second capacitance wire 18.

In this example, the diameters 62, 68 of the second and third pair of vias 58, 60, 64, 66, respectively, allow for the electrical connection of the nominal capacitance wire 16 and the first trim capacitance wires 14, or both the first and second trim capacitance wires 14, 18. In contrast, the diameter 56 of the first pair of vias 48, 50 only allows for the electrical connection of the nominal capacitance wire 16. The capacitance value of capacitors in parallel add ($C_{final}=C_1+C_2+C_3$), therefore, if the approximated capacitance value, (obtained using methods described supra), is less than the target value by more than a tolerance value, the trim capacitors are added in parallel to increase the capacitance of the MIM capacitor 10.

In the previous examples a single photolithography process was performed to form all of the vias. Alternatively, each of the vias may be formed having different diameters as needed. For example, more than one photolithography process may be performed, where multiple passes are performed using multiple masks to print and etch each via separately. Alternatively, a direct write process may be performed to form each of the vias. In the example illustrated in FIG. 13 a first via 70 is formed having a first diameter 72, and a second via 74 is formed having a second diameter 76, wherein the diameter 72 of the first via 70 is larger than the diameter 76 of the second via 74. This may be useful, as in this example, when one via 70 needs to electrically connect multiple wires, therefore, needs to have a larger diameter 72, and the other via 74 only needs to electrically connect one wire, and therefore, only requires a smaller diameter 76.

Figure 14:
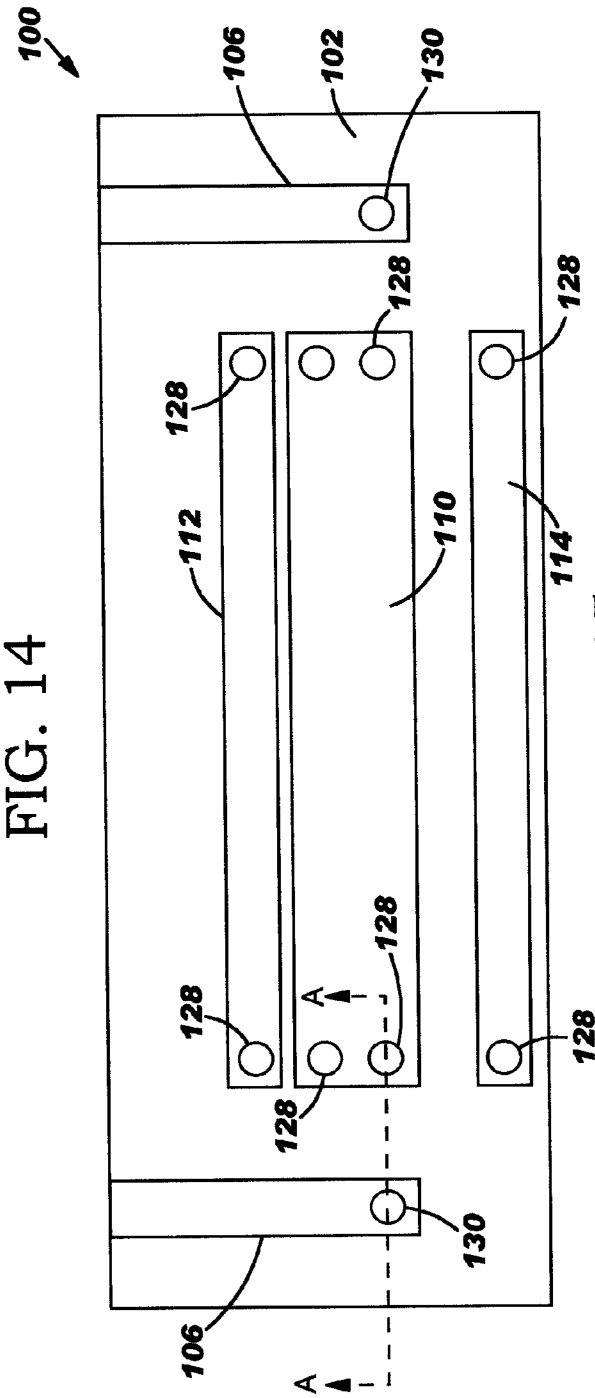
FIG. 14 depicts a top view of a resistor in accordance with embodiments of the present invention.
Figure 15:
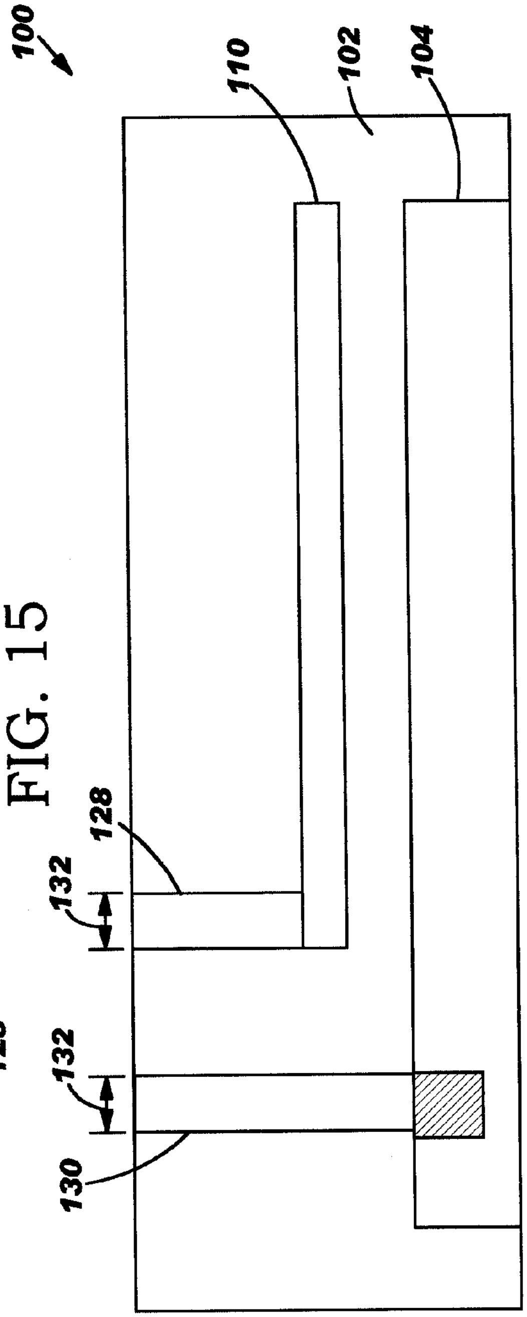
FIG. 15 depicts a cross-sectional view of the resistor of FIG. 14 along line A—A.

FIGS. 14–22 show another example of the present invention in conjunction with a resistor. In particular, FIG. 14 shows a top view of a resistor 100 and FIG. 15 shows a cross-sectional view of the resistor 100 of FIG. 14 along line A—A. The resistor 100 comprises an insulative layer 102 formed of a plurality of inter-metal dielectric layers. The resistor 100 further comprises a substrate 104 formed within the insulative layer 102 as is known in the art. The substrate 104 may comprises an insulative material as known in the art. The substrate 104 comprises a first pair of electrically conductive wires 106 formed within the substrate 104. The resistor 100 further comprises a nominal resistor 110, a first trim resistor 112 and a second trim resistor 114 formed within the insulative layer 102.

After the formation of the resistor, as known in the art, an approximation of the final resistance value is obtained using the techniques described supra with regard to the capacitor 10. If the approximated final resistance value is within an allowed tolerance value of a target resistance value then vias are formed to electrically connect a nominal resistance wire. If, however, the approximated final resistance is not within the allowed tolerance value of the target resistance value then vias are formed having a diameter large enough to electrically connect the nominal resistance wire and at least one trim resistance wire in parallel.

Vias are formed within the insulative layer 102 in accordance within the present invention. As described supra, a layer of photoresist is deposited over the insulative layer 102. A mask, having a substantially transparent region for each via to be formed and a substantially non-transparent region surrounding the substantially transparent region(s), is then used to pattern the photoresist. A radiation source projects light onto the mask thereby exposing the photoresist in the substantially transparent region(s) of the mask. The exposed region of photoresist is removed, leaving the unexposed region(s) of photoresist. Alternatively a negative photoresist could be used to pattern the vias, in which case the substantially transparent resion(s) and the substantially opaque region(s) of the mask would be inverted. An etch process, such as reactive ion etching (RIE), laser ablation, wet etch, etc., is performed to remove a portion of the insulative layer 102 within the unexposed region(s) of photoresist thereby forming the vias.

In the present example, vias 128 are formed within the insulative layer 102 down to, and contacting, the nominal resistor 110, the first trim resistor 112 and the second trim resistor 114. During the same formation step, and using the same photoresist mask, a first pair of vias 130 are formed within the insulative layer 102 down to, and contacting, the wires 106 within the substrate 104. The first pair of vias 130 have a first diameter 132 capable of electrically connecting one top wire (formed infra) to the bottom wire 106 within the substrate 104. The first pair of vias 130 would be formed if the approximated resistance value obtained supra was within the allowed tolerance value of the target resistance value.

Figure 16:
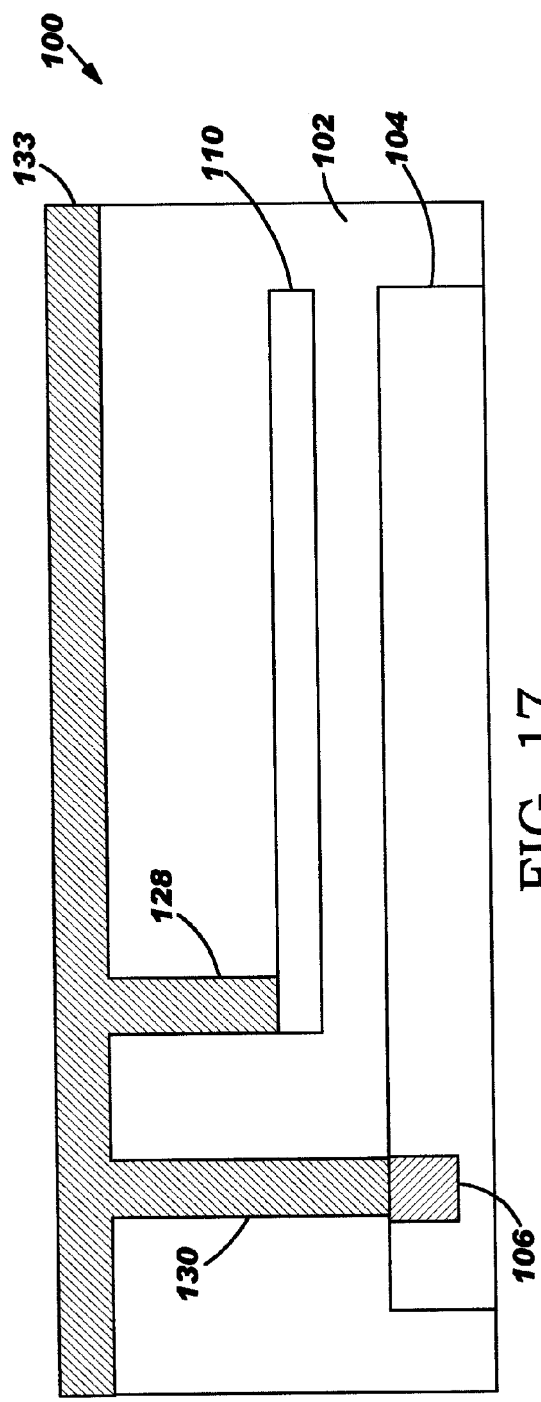
FIG. 16 depicts a cross-sectional view of the device of FIG. 14 along line A—A having a conductive layer thereon.
Figure 17:
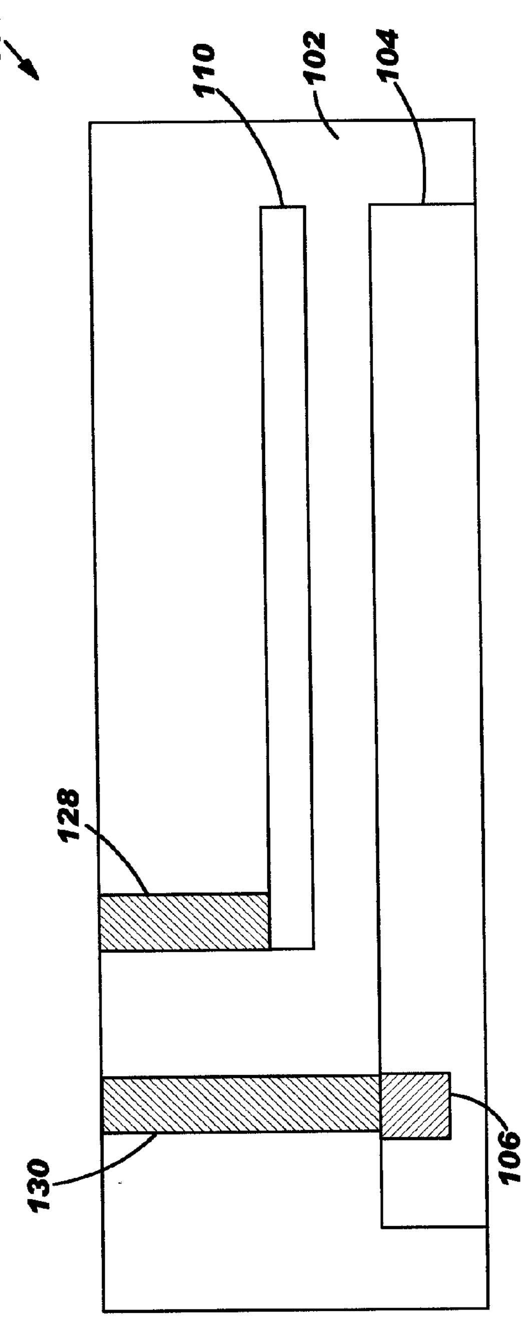
FIG. 17 depicts a cross-sectional view of the device of FIG. 14 along line A—A following polishing.
Figure 18:
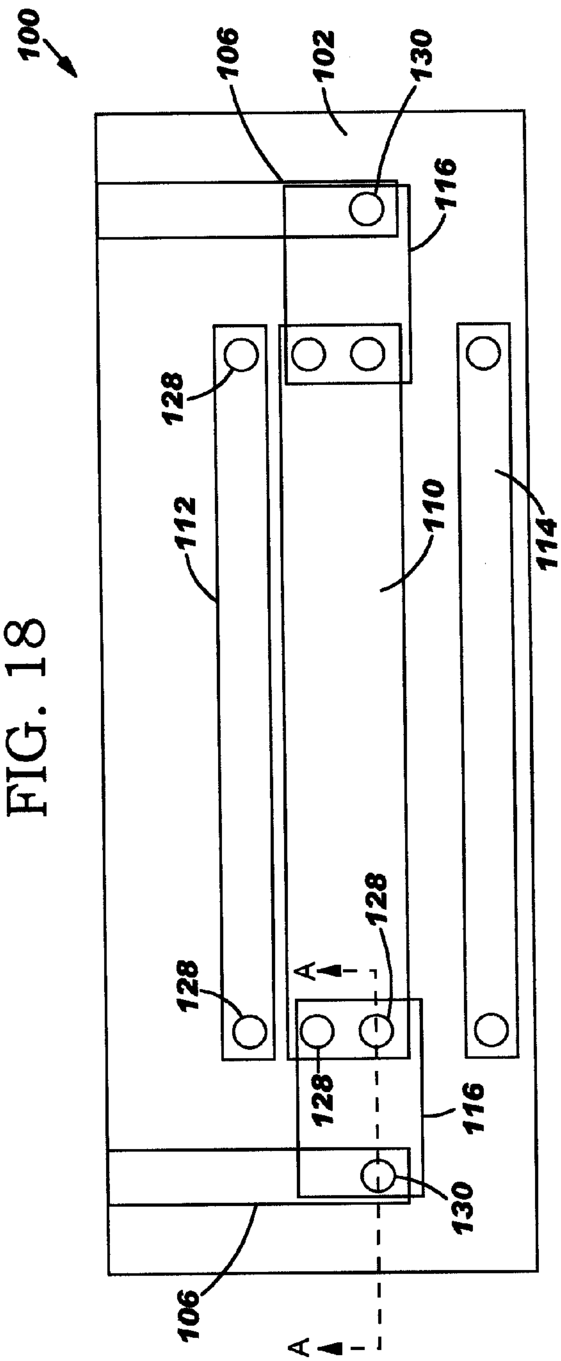
FIG. 18 depicts a top view of the resistor of FIG. 14 having a first plurality of vias formed therein in accordance with the present invention.
Figure 19:
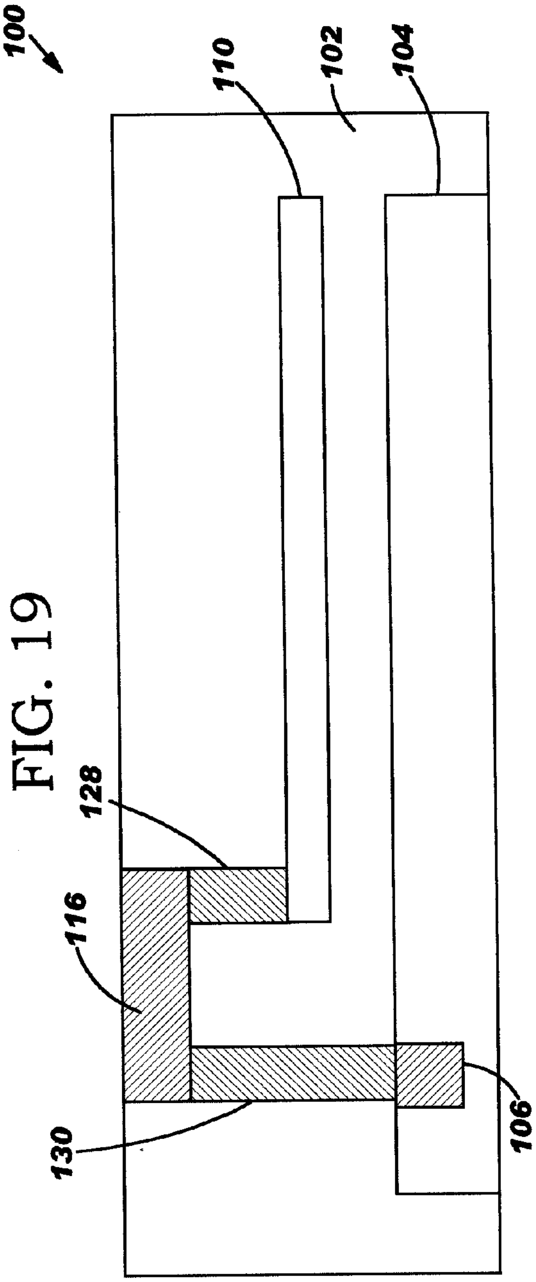
FIG. 19 depicts a cross-sectional view of the device of FIG. 18 along line A—A.

As described supra, a conductive layer 133 is then deposited over the insulative layer 102 of the resistor device 100, filling the vias 128, 130 (FIG. 16). A polishing operation is performed to remove the excess conductive material 133 on the surface of the insulative layer 102 leaving the conductive material 133 only within the vias 128, 130 thereby forming a electrically conductive vias 128, 130, as illustrated in FIG. 17. Alternatively, the vias 128, 130 could have been electrolessly plated, or filled using a selective CVD deposition, (as described supra) with a conductive material to form an electrically conductive via rather than completely filling the vias 128, 130. Wires are then formed over the insulative layer 102 in the region of, and electrically connecting to, the vias 128 of the nominal resistor 110 and the vias 130 above wires 106 (FIGS. 18 and 19).

In the event the approximated resistance value was not within the allowed tolerance value of the target resistance value the diameter of the vias would be altered. For example, if the approximated resistance value was too high vias would be formed having a diameter capable of forming an electrical connection to the nominal resistance wires and at least one of the trim resistance wires, since resistors in parallel decrease resistance (1/Total Resistance=$1/R_1+1/R_2+1/R_3$).

Figure 20:
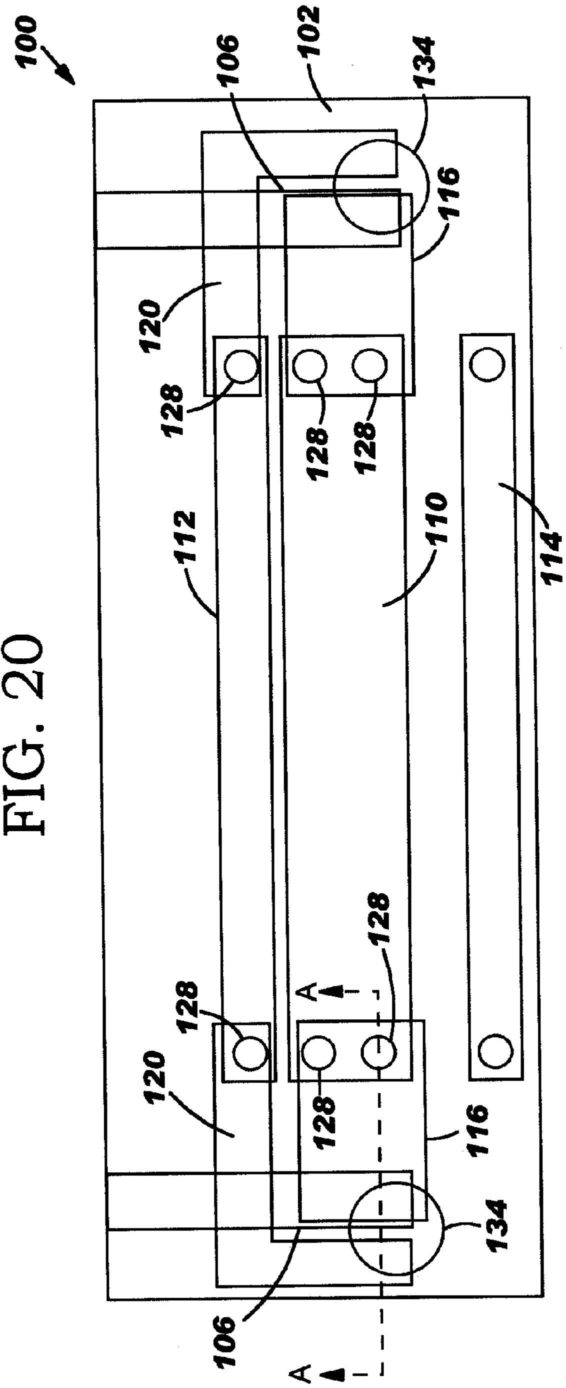
FIG. 20 depicts a top view of the resistor of FIG. 14 having a second plurality of vias formed therein in accordance with the present invention.
Figure 21:
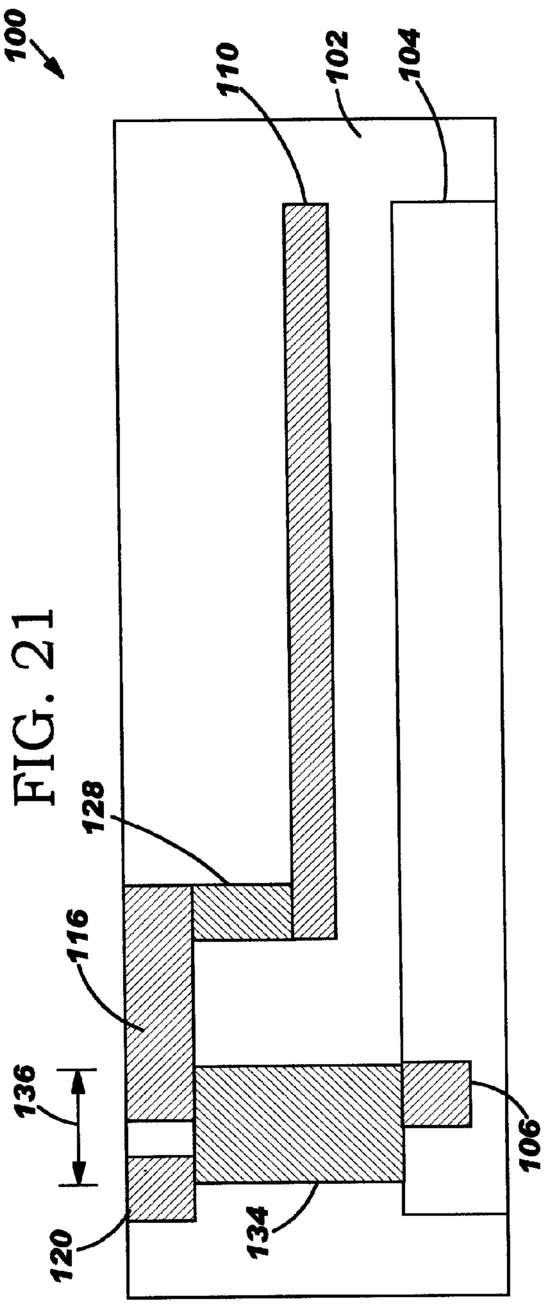
FIG. 21 depicts a cross-sectional view of the device of FIG. 20 along line A—A.
Figure 22:
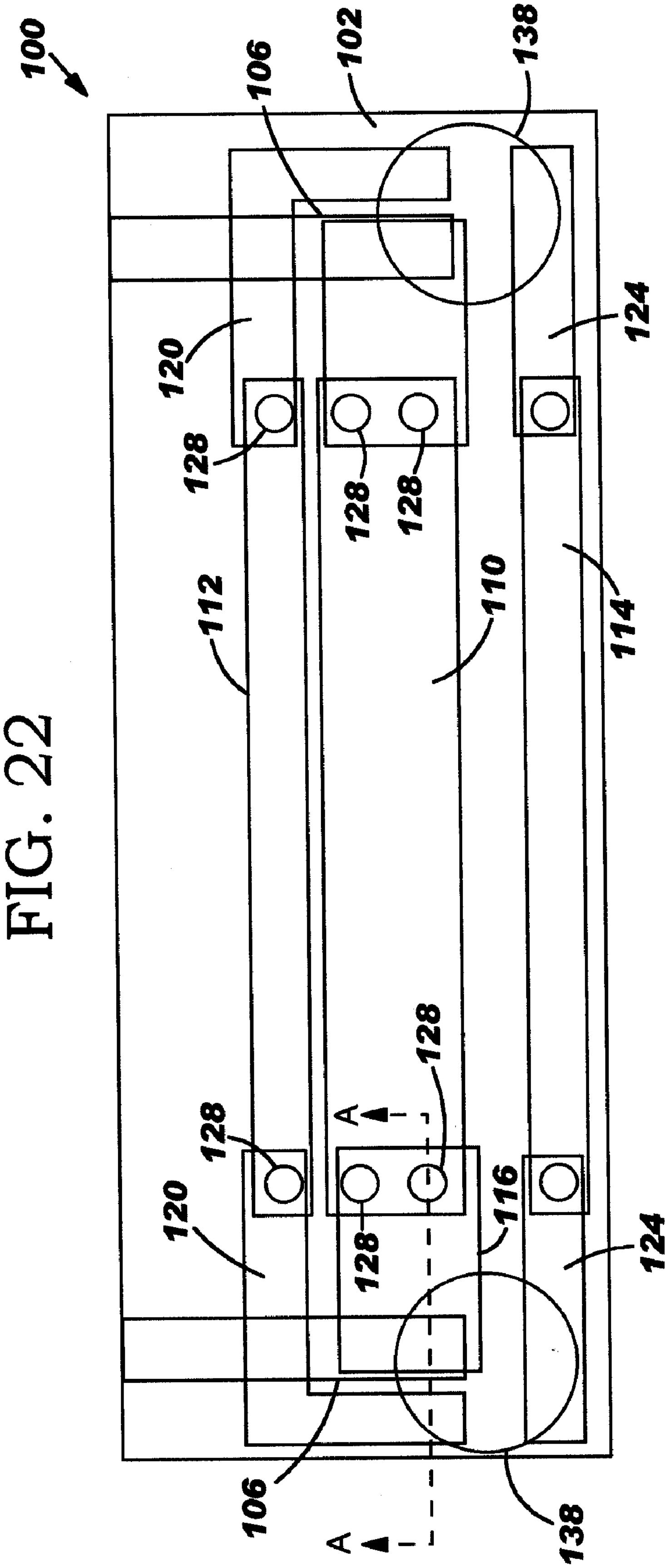
FIG. 22 depicts a top view of the thin film resistor of FIG. 14 having a third plurality of vias formed therein in accordance with the present invention.

As illustrated in FIGS. 20 and 21, a second pair of vias 134 may be formed having a diameter 136 capable of electrically connecting the nominal resistor 110 and the first trim resistor 112 to the bottom wire 106 within the substrate 104. Following formation of the vias 134 in accordance with the method of the present invention described supra, wires 120 are formed electrically connecting the first trim resistor 112 to the via 134. Likewise, as illustrated in FIG. 22, a third pair of vias 138 may be formed having a diameter 140 capable of electrically connecting the nominal resistor 110, the first trim resistor 112 and the second trim resistor 114 to the bottom wire 106 within the substrate 104. Following formation of the vias 138 in accordance with the method of the present invention described supra, wires 124 are formed electrically connecting the second trim resistor 114 to the vias 138.

Figure 13:
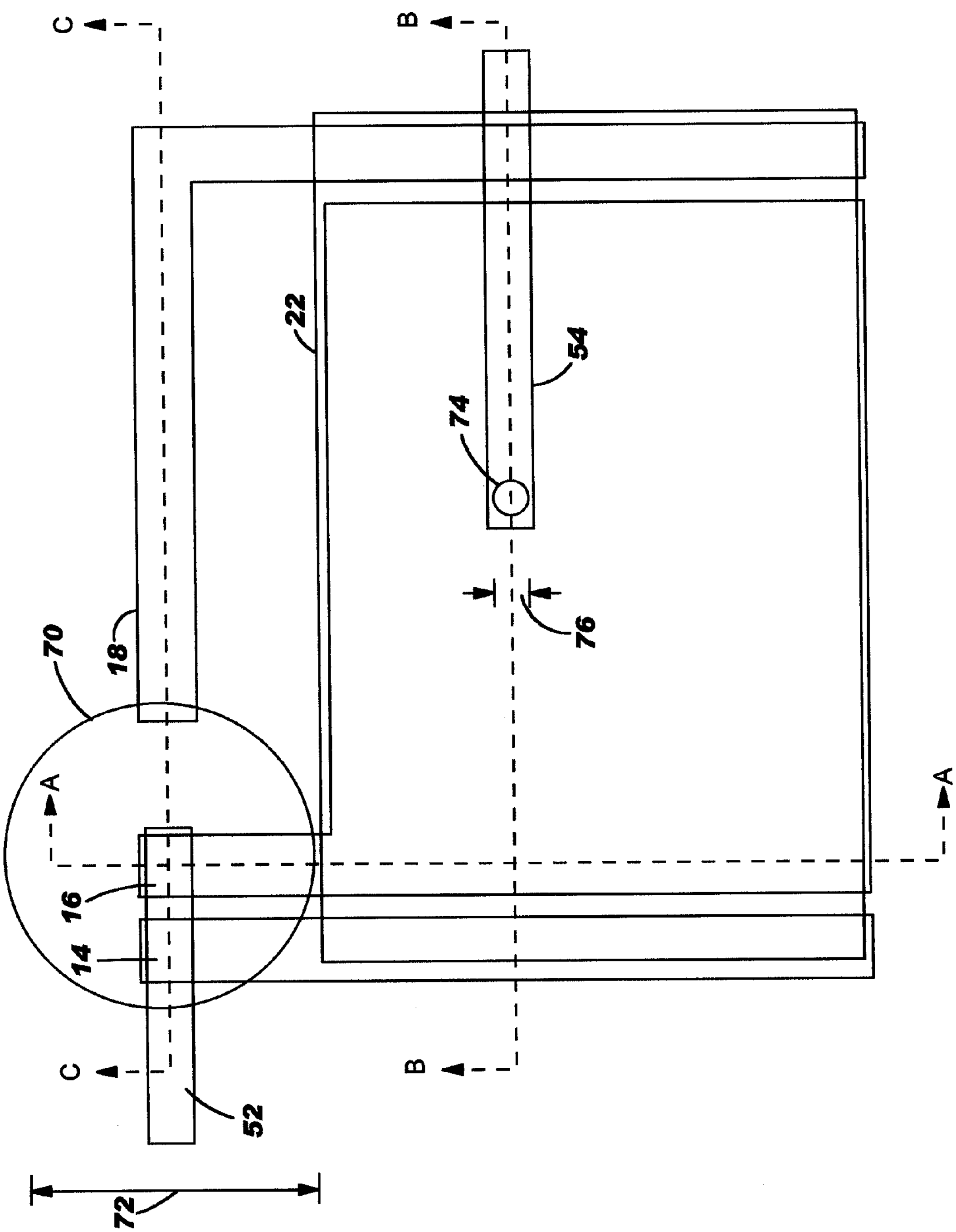
FIG. 13 depicts a top view of the device of FIG. 1 having an alternate pair of vias formed therein in accordance with the present invention.

As with the embodiment illustrated in FIG. 13 of the capacitor example, the vias 128 connecting the wires 116, 120, 124 to the resistors 110, 112, 114 have a diameter 132 that does not change as the diameter of the other vias 130, 134, 138 change because this example shows a direct write process, or the use of multiple photolithography passes.

Conventionally, multiple mask sets would be required in order to form each of the different vias having different diameters. However, the present invention provides for the formation of the vias having different diameters using a single mask set merely by varying the processing parameters. Rather than using multiple mask sets, the photolithography exposure time and etch parameters may be varied to change the diameter of the vias formed. For instance, a mask set providing for the formation of a 100 nm via opening could be modified, either during the exposure or etch, to form a 150 nm–200 nm via opening, or vice versa.

As an example, the oxygen flow used during a reactive ion etch (RIE) process may be altered to vary the diameter of the via. For example, during a via RIE process using perflorocarbon (PFC) gases, e.g., $CF_4$, or hydroflorocarbon (HFC) gases, e.g., $CHF_3$, diluted with argon, at a pressure of about 100 mT, the amount of oxygen may be varied to produce different via diameters. During a first iteration no oxygen is flowed during the RIE process. During a second iteration an oxygen flow equal to 10% of the argon flow is dispensed during the RIE. The diameter of the via formed during the second iteration may be up to 50 nm larger than the diameter of the via formed during the first iteration.

Likewise, changing the type of photoresist material used during the photolithography process may produce vias having different diameters. For example, with a via opening of 100 nm in the lithographic mask, a via having a diameter of about 100 nm may be formed using a JSR M20G (JSR Corporation, Japan) photoresist. Using the same processing parameters and the same photolithography mask set, a TOK UV82 (TOK Corporation, Japan) photoresist may produce a via having diameter of about 150 nm. Therefore, if it is desirable to contact only one first wire of the device a photoresist having properties that causes smaller images to be printed, such as JSR M20G, could be used to produce a via having a diameter of the appropriate size to electrically contact the one wire. On the other hand, if it is desirable to contact two wires of the device a photoresist having properties that causes larger images to be printed, such as TOK UV82, could be used to produce a via having a larger diameter capable of providing electrical contact to the two wires.

The diameter of the vias may also be varied by changing the exposure wavelength or by using a different photoresist. For instance, if an exposure wavelength of 248 nm and a 248 nm wavelength photoresist were used with a 248 nm attenuated phase shift mask, with a via opening of 200 nm, a via having a diameter of about 200 nm may be printed. If, however, a 193 nm wavelength and a 193 nm wavelength photoresist were used with the same 248 nm attenuated phase shift mask, a via having a diameter of about 140 nm may print. Therefore, vias having different diameters may be printed using a single mask by merely changing the exposure wavelength.

Another use for the method and structure of the present invention is to replace physical fusing. Physical fusing, such as laser fusing, is used to open or close select wires or lines to provide added wiring options. As mentioned in the Background, fusing has several disadvantages. For example, fusing requires the formation of additional wiring in the event a line needs to be opened/closed. Also, the additional wiring needed for fusing adds complexity and cost to the manufacturing process. The present invention allows for multiple wiring options, and the variation of wiring configurations during manufacturing, without these and other related problems. In contrast, as described above, when an additional connection(s) is required a via having a larger diameter is formed, thereby connecting more wires. Likewise, when fewer connections are required a via having a smaller diameter is formed, thereby connecting fewer wires.

The present invention has many other advantages over the currently used techniques. For example, only one mask set is needed, rather than the multiple mask sets previously required. The diameter of the vias formed using the present invention may be altered by changing the processing parameters, as described above, not using a different mask set.

In addition to conventional photolithography processes, a direct write photolithography process may be used. A direct write photolithography process does not require the use of a mask. Instead, a layer of photoresist is deposited on the surface of the device and light is shined directly onto the resist. The exposure and etch conditions may be altered to control the diameter of the via formed.

Figure 23:
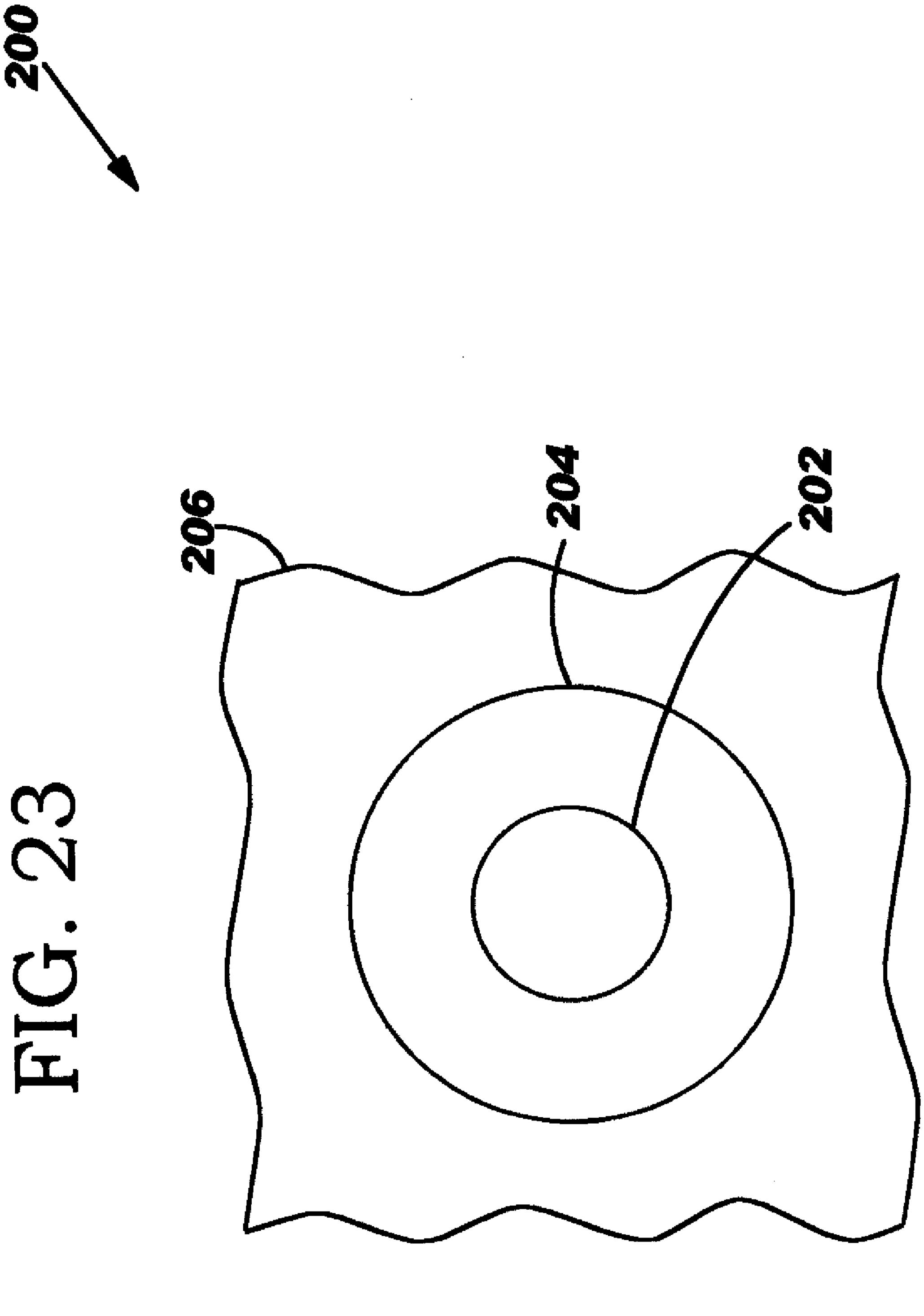
FIG. 23 depicts a top view of a mask used in accordance with the present invention.

Similarly, a photolithography process using a gray scale mask may be employed. Conventional photoresist masks are either substantially opaque, allowing substantially 0% light transmission, or substantially transparent, allowing substantially 100% light transmission. A gray scale mask is comprised of partially opaque regions and/or partially transparent regions. For example, as illustrated in FIG. 23 a mask 200 may be used to pattern a photoresist layer on a device. The mask 200 may comprise a first region 202, in this example, a substantially 100% transparent region, that is designed to pattern a 100 nm via. The mask 200 also comprises a second region 204, in this example, a 30% transparent region, that is designed to pattern a 200 nm via. And finally, the mask 200 comprises a third region 206 that is substantially 100% opaque. Therefore, if a 100 nm via is desired, the photoresist is exposed to a first wavelength of light, or exposure condition, that will expose only the first region 202 which is 100% transparent, leaving the second region 204 and the third region 206 unexposed. On the other hand, if a 200 nm via is desired, the photoresist is exposed to a second wavelength of light, different from the first wavelength of light, that will expose both the first region 202, which is 100% transparent, and the second region 204, which is 30% transparent, leaving the third region 206 unexposed.

It should be noted that although the present invention has been described and illustrated using vias having subsequently increasing diameters, the scope of the invention is not intended to be limited as such. Rather, the present invention is also intended to encompass the formation of vias having subsequently smaller diameters formed during the course of a single production run.

It should also be noted that frequently, the thickness of the thin film resistor or MIM dielectric varies across a wafer in a measurable pattern, therefore, device chips may be formed on a single wafer having different via sizes. Using a map of the thin film layer thickness, the final capacitance or resistance can be predicted and the via size of each lithographic reticle can be tailored. For example, a wafer might have thinner MIM dielectric thickness on the wafer edge chips than the center chips. If increasing the via size and wiring in additional plates of the capacitor increases the capacitance, then choosing a large via size in the wafer center chips, to wire in two plates; and a small via size on the wafer edge chips, to wire in only one plate, could be performed to reduce the final capacitance variability across the wafer.

It should also be noted that the examples of the present invention illustrated the vias having a circular shape for illustration purposes only. It is also foreseeable that the vias could be formed having a variety of different shapes. For example, the vias may be formed in a T-shape, rectangular vias, vias formed in bar shapes, etc. The present invention is in no way intended to be limited by the shape illustrated herein.

What is claimed is:

1. A method of forming a variable contact structure, comprising:

providing a tunable device;

determining a measurable parameter of the tunable device; and forming at least one electrically conductive via within the tunable device, using a mask, wherein a diameter of the at least one via is determined based upon the measurable parameter, and wherein the diameter of the at least one via may be formed larger than an opening in the mask by varying processing parameters used to form the at least one via.

2. The method of claim 1, wherein determining the measurable parameter of the tunable device further comprises:

measuring a value of a physical parameter of the device;

comparing the value of the physical parameter to a target value; and forming the at least one via having a first diameter, to electrically connect one wire, if the value of the physical parameter is within an allowed tolerance value of the target value, or forming the at least one via having a second diameter, to electrically connect at least two wires, if the value of the physical parameter is different from the target value by more than an allowed tolerance value, wherein the second diameter is greater than the first diameter.

3. The method of claim 2, wherein forming the at least one electrically conductive via further comprises:

depositing a photoresist on a surface of the device;

exposing the photoresist through the mask;

developing the photoresist; and selectively etching a portion of the device to form the at least one via.

4. The method of claim 3, before exposing the photoresist, further comprising:

using a gray scale mask to pattern the photoresist, wherein the gray scale mask comprises:

a substantially transparent region having a diameter equal to the first diameter of the at least one via;

a substantially semi-transparent region surrounding the substantially transparent region, having a diameter equal to the second diameter of the at least one via, wherein the substantially semi-transparent region is less transparent than the substantially transparent region; and a substantially non-transparent region surrounding the substantially semi-transparent region, wherein the substantially non-transparent region is less transparent than the substantially semi-transparent region.

5. The method of claim 2, wherein the second diameter is made larger than the first diameter by using a first type of photoresist to form the at least one via having the first diameter and a second type of photoresist to form the at least one via having the second diameter, wherein the first type of photoresist has different optical properties from the second type of photoresist.

6. The method of claim 2, wherein the second diameter is made larger than the first diameter by increasing a gas flow rate during a reactive ion etch.

7. The method of claim 2, wherein the second diameter is made larger than the first diameter by exposing photoresist to a wavelength of light during patterning of the at least one via having the second diameter different from a wavelength of light used during patterning of the at least one via having the first diameter.

8. The method of claim 2, wherein measuring the value or the physical parameter of the device is performed using a techniques selected from the group consisting of: measuring a thickness of a film within the device using optical techniques, cleaving the device using all electron microscope, measuring a thickness of a film within the device using a step height measurement tool, and determining an atomic composition of a film within the device using stoichiometry.

9. The method of claim 2, wherein forming the at least one electrically conductive via further comprises:

forming an at least one first via having the first diameter and an at least one second via having the second diameter using a direct write process.

10. The method of claim 1, wherein the device comprises a tunable device comprising one of: a plurality of resistors, a plurality of capacitors and a plurality of inductors.

11. A method of forming a variable contact structure, comprising:

providing a tunable device having at least two circuit structures;

determining a measurable parameter of the tunable device, wherein the measurable parameter approximates a parametric value of the device; and if the measurable parameter was within an allowed tolerance value of a target value, then:

forming at least one electrically conductive via within the tunable device, using a mask, having a first diameter to form electrical contact with the first circuit structure; and if the measurable parameter was not within the allowed tolerance value of the target value, then:

forming at least one electrically conductive via within the tunable device, using the mask, having a second diameter, wherein the second diameter is greater than the first diameter, to form electrical contact with the first circuit structure and at least one second circuit structure.

12. The method of claim 11, wherein forming the at least one via further comprises:

applying a photoresist on a surface of the device;

exposing the photoresist through the mask;

developing the photoresist; and selectively etching a portion of the device to form the at least one via.

13. The method of claim 11, wherein the second diameter is made larger than the first diameter by using a first type of photoresist to form the at least one via having the first diameter and a second type of photoresist to form the at least one via having the second diameter, wherein the first type of photoresist has different optical properties from the second type of photoresist.

14. The method of claim 13, before exposing the photoresist, further comprising:

using a gray scale mask to pattern the photoresist, wherein the gray scale mask comprises:

a substantially transparent region having a diameter equal to the first diameter of the at least one via;

a substantially semi-transparent region surrounding the transparent region, wherein the substantially semi-transparent region is less transparent than the substantially transparent region, having a diameter equal to the second diameter of the at least one via; and a substantially non-transparent region surrounding the semi-transparent region, wherein the substantially non-transparent region is less transparent than the substantially semi-transparent region.

15. The method of claim 11, wherein the second diameter is made larger than the first diameter by increasing a gas flow rate during a reactive ion etch.

16. The method of claim 11, wherein the second diameter is made larger than the first diameter by exposing photoresist to a wavelength of light during patterning of the at least one via having the second diameter different from a wavelength of light used during patterning of the at least one via having the first diameter.

17. The method of claim 11, wherein the tunable device comprises one of: a plurality of resistors, a plurality of capacitors and a plurality of inductors.

* * * * *